(12) United States Patent
Kim et al.

(10) Patent No.: US 11,791,362 B2
(45) Date of Patent: Oct. 17, 2023

(54) IMAGE SENSOR AND METHOD OF FABRICATING THE SAME

(71) Applicant: Samsung Electronics Co., Ltd., Suwon-si (KR)

(72) Inventors: Sang-Hoon Kim, Seongnam-si (KR); Kwan Hee Lee, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 272 days.

(21) Appl. No.: 17/007,332

(22) Filed: Aug. 31, 2020

(65) Prior Publication Data

US 2021/0242267 A1    Aug. 5, 2021

(30) Foreign Application Priority Data

Jan. 30, 2020   (KR) ........................ 10-2020-0010861

(51) Int. Cl.
*H01L 31/101*   (2006.01)
*H01L 27/146*   (2006.01)

(52) U.S. Cl.
CPC .... *H01L 27/14636* (2013.01); *H01L 27/1463* (2013.01); *H01L 27/14603* (2013.01); *H01L 27/14621* (2013.01); *H01L 27/14627* (2013.01); *H01L 27/14689* (2013.01)

(58) Field of Classification Search
None
See application file for complete search history.

(56) References Cited

U.S. PATENT DOCUMENTS

| 8,300,127 | B2 | 10/2012 | Akiyama |
| 8,541,878 | B2 * | 9/2013 | Takahashi ............. H04N 25/79 |
| | | | 257/E23.152 |
| 8,890,331 | B2 * | 11/2014 | Shimotsusa .......... H01L 31/024 |
| | | | 257/431 |
| 9,059,062 | B2 | 6/2015 | Yorikado et al. |
| 9,425,231 | B2 * | 8/2016 | Kim .................... H01L 27/1463 |

(Continued)

*Primary Examiner* — Ali Naraghi
(74) *Attorney, Agent, or Firm* — Muir Patent Law, PLLC

(57) ABSTRACT

An image sensor with improved performance, and a method of fabricating the same are provided. The image sensor includes a sensor array region and a pad region, which is disposed outside the sensor array region, the image sensor comprising a first substrate including a first surface, upon which light is incident, and a second surface, which is opposite to the first surface, a first isolation film in the first substrate at the sensor array region, the first isolation film defining a plurality of unit pixels, a second substrate including a third surface, which faces the second surface of the first substrate, and a fourth surface, which is opposite to the third surface, a wiring structure between the second and third surfaces, the wiring structure including an interlayer insulating film and a wiring in the interlayer insulating film, a pad trench in the pad region, the pad trench exposing the wiring through the first substrate, a bonding terminal in the pad trench, the bonding terminal being connected to the wiring, and a second isolation film in the first substrate at the pad region, the second isolation film being adjacent to the pad trench, wherein widths of each of the first and second isolation films decrease in a direction from the second surface to the first surface.

17 Claims, 17 Drawing Sheets

(56) References Cited

U.S. PATENT DOCUMENTS

| | | | |
|---|---|---|---|
| 2009/0140365 A1* | 6/2009 | Lee | H01L 27/14683 |
| | | | 257/460 |
| 2010/0304547 A1* | 12/2010 | Pinto | H01L 21/823807 |
| | | | 438/424 |
| 2012/0313208 A1 | 12/2012 | Kim et al. | |
| 2018/0182808 A1 | 6/2018 | Kim et al. | |
| 2020/0058684 A1* | 2/2020 | Wu | H01L 27/14607 |
| 2021/0366953 A1* | 11/2021 | Hsu | H01L 27/14685 |

* cited by examiner

IMAGE SENSOR AND METHOD OF FABRICATING THE SAME

This application claims priority under 35 U.S.C. § 119 to Korean Patent Application No. 10-2020-0010861, filed on Jan. 30, 2020, the disclosure of which is incorporated herein by reference in its entirety.

BACKGROUND

1. Technical Field

The present disclosure relates to an image sensor and a method of fabricating the same, and more particularly, to an image sensor including isolation films and a method of fabricating the image sensor.

2. Description of the Related Art

An image sensor is a type of semiconductor device that converts optical information into electrical signals. Examples of an image sensor may include a charge coupled device (CCD) image sensor and a complementary metal-oxide semiconductor (CMOS) image sensor.

The image sensor may be configured in the form of a package, and the package may be configured to have a structure that can protect the image sensor and can allow light to be incident upon a photo-receiving surface or a sensing area of the image sensor.

Recently, a backside illumination (BSI) image sensor in which incident light is irradiated through the rear side of a semiconductor substrate has been studied to impart improved light-receiving efficiency and light sensitivity to pixels formed in the image.

SUMMARY

Embodiments of the present disclosure provide an image sensor with improved performance.

Embodiments of the present disclosure also provide a method of fabricating an image sensor with improved performance.

However, embodiments of the present disclosure are not restricted to those set forth herein. The above and other embodiments of the present disclosure will become more apparent to one of ordinary skill in the art to which the present disclosure pertains by referencing the detailed description of the present disclosure given below.

According to an embodiment of the present disclosure, there is provided an image sensor including a sensor array region and a pad region, which is disposed outside the sensor array region, the image sensor comprising a first substrate including a first surface, upon which light is incident, and a second surface, which is opposite to the first surface, a first isolation film in the first substrate at the sensor array region, the first isolation film defining a plurality of unit pixels, a second substrate including a third surface, which faces the second surface of the first substrate, and a fourth surface, which is opposite to the third surface, a wiring structure between the second and third surfaces, the wiring structure including an interlayer insulating film and a wiring in the interlayer insulating film, a pad trench in the pad region, the pad trench exposing the wiring through the first substrate, a bonding terminal in the pad trench, the bonding terminal being connected to the wiring, and a second isolation film in the first substrate at the pad region, the second isolation film being adjacent to the pad trench, wherein widths of each of the first and second isolation films decrease in a direction from the second surface to the first surface.

According to the aforementioned and other embodiments of the present disclosure, there is provided an image sensor including a sensor array region, and a connecting region and a pad region, which are disposed outside the sensor array region, the image sensor comprising a first substrate including a first surface, upon which light is incident, and a second surface, which is opposite to the first surface, a first isolation film in the first substrate at the sensor array region, the first isolation film defining a plurality of unit pixels, a first wiring structure on the second surface of the first substrate, the first wiring structure including a first wiring in the connecting region, a second substrate including a third surface, which faces the second surface of the first substrate, and a fourth surface, which is opposite to the third surface, a second wiring structure on the third surface of the second substrate, the second wiring structure including a second wiring in the connecting region and a third wiring in the pad region, a connecting structure in the connecting region, the connecting structure electrically connecting the first and second wirings, a second isolation film in the first substrate at the connecting region, the second isolation film being disposed between the sensor array region and the connecting structure, a bonding terminal in the pad area, the bonding terminal being connected to the third wiring, and a third isolation film in the first substrate at the pad region, the third isolation film being disposed between the sensor array region and the bonding terminal, wherein widths of each of the first, second, and third isolation films decrease in a direction from the second surface to the first surface.

According to the aforementioned and other embodiments of the present disclosure, there is provided an image sensor including a sensor array region and a pad region, which is disposed outside the sensor array region, the image sensor comprising a first substrate including a first surface, upon which light is incident, and a second surface, which is opposite to the first surface, a plurality of photoelectric conversion layers in the first substrate at the sensor array region, a first isolation film in the first substrate at the sensor array region, the first isolation film separating the photoelectric conversion layers from one another, a second substrate including a third surface, which faces the second surface of the first substrate, and a fourth surface, which is opposite to the third surface, a wiring structure between the second and third surfaces, the wiring structure including an interlayer insulating film and a wiring in the interlayer insulating film, a pad trench in the pad region, the pad trench exposing the wiring through the first substrate, a bonding terminal in the pad trench, the bonding including a ball portion connected to the wiring, and a second isolation film in the first substrate at the pad region, the second isolation film being disposed between the sensor array region and the bonding terminal, wherein widths of each of the first and second isolation films decrease in a direction from the second surface to the first surface, the first isolation film includes a first oxide film, which extends along a first substrate trench in the first substrate, and the second isolation film includes a second oxide film, which extends along a second substrate trench in the first substrate.

According to the aforementioned and other embodiments of the present disclosure, there is provided a method of fabricating an image sensor, the method comprising providing a first substrate, including a sensor array region and a pad region, which is disposed outside the sensor array region, the first substrate having a first surface, upon which light is incident, and a second surface, which is opposite to the first surface, forming a first isolation film in the first substrate at the sensor array region and a second isolation film in the first substrate at the pad region by performing an etching process on the second surface of the first substrate, forming a first substrate structure on the second surface of the first substrate by stacking a wiring structure, including an interlayer insulating film and a wiring in the interlayer insulating film, forming a second substrate structure, including a third surface, which faces the second surface of the first substrate and a fourth surface, which is opposite to the third surface, bonding the first and second substrate structures so that the second and third surfaces face each other, forming a pad trench, which exposes the wiring through the first substrate, in the pad region, and forming a bonding terminal, which is connected to the wiring, in the pad trench.

Other features and embodiments may be apparent from the following detailed description, the drawings, and the claims.

BRIEF DESCRIPTION OF THE DRAWINGS

The above and other embodiments and features of the present disclosure will become more apparent by describing in detail embodiments thereof with reference to the attached drawings, in which.

DETAILED DESCRIPTION

An image sensor according to some embodiments of the present disclosure will hereinafter be described with reference to FIGS. 1 through 10.

Figure 1:
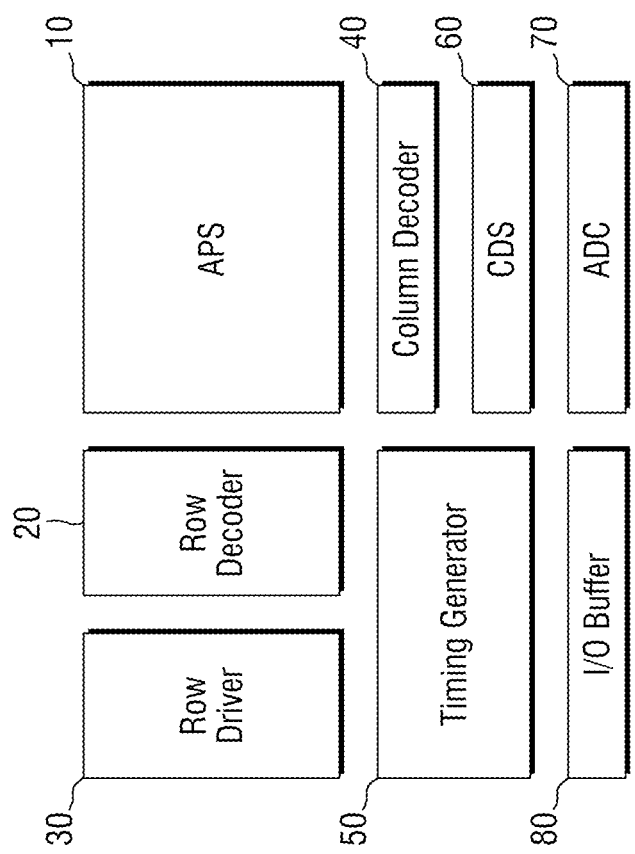
FIG. 1 is a block diagram of an image sensor according to some embodiments of the present disclosure.

FIG. 1 is a block diagram of an image sensor according to some embodiments of the present disclosure.

Referring to FIG. 1, the image sensor according to some embodiments of the present disclosure includes an active pixel sensor array (APS) 10, a row decoder 20, a row driver 30, a column decoder 40, a timing generator 50, a correlated double sampler (CDS) 60, an analog-to-digital converter (ADC) 70, and an input/output (I/O) buffer 80.

The APS 10 may include a plurality of unit pixels, which are arranged two-dimensionally, and may convert an optical signal into an electrical signal. The APS 10 may be driven by a plurality of driving signals from the row driver 30, such as a pixel selection signal, a reset signal, and a charge transfer signal. The electrical signal obtained by the APS 10 may be provided to the CDS 60.

The row driver 30 may provide a plurality of driving signals for driving the unit pixels to the APS 10 based on the result of decoding performed by the row decoder 20. In a case where the unit pixels are arranged in a matrix, the driving signals may be provided in units of rows of the matrix.

The timing generator 50 may provide timing signals and control signals to the row decoder 20 and the column decoder 40.

The CDS 60 may receive an electrical signal generated by the APS and may hold and sample the received electrical signal. The CDS 60 may double-sample a particular noise level and a signal level caused by an electrical signal and may output an analog signal corresponding to the difference between the particular noise level and the signal level.

The ADC 70 may convert the analog signal output by the CDS 60 into a digital signal and may output the digital signal.

The I/O buffer 80 may latch the digital signal and may sequentially output the latched digital signal to an image signal processor (not illustrated) in accordance with the result of decoding performed by the column decoder 40.

Figure 2:
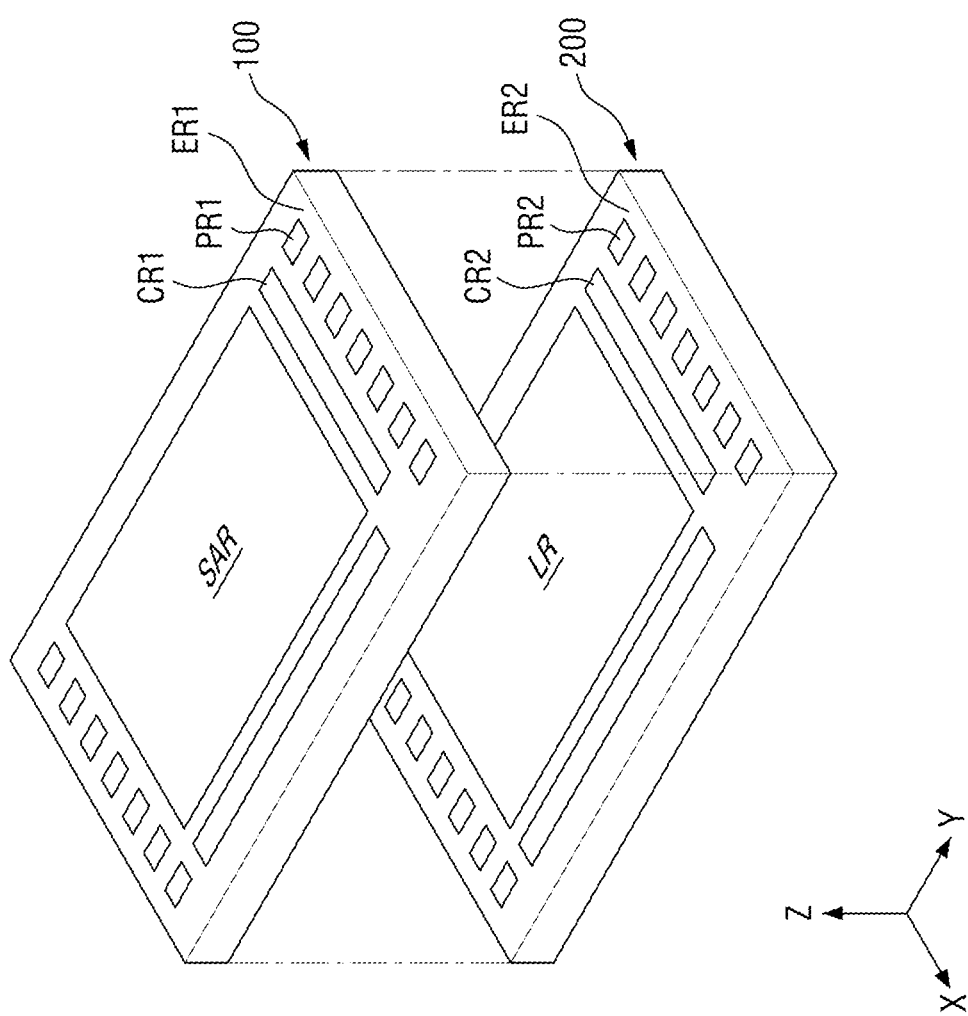
FIG. 2 is a perspective view illustrating the layout of an image sensor according to some embodiments of the present disclosure.

FIG. 2 is a perspective view illustrating the layout of an image sensor according to some embodiments of the present disclosure.

Referring to FIG. 2, the image sensor according to some embodiments of the present disclosure includes a first substrate structure 100 and a second substrate structure 200.

The first substrate structure 100 may be stacked on the second substrate structure 200. In some embodiments, the first substrate structure 100 may include a sensor array region SAR, a first connecting region CR1, first pad regions PR1 (e.g., a plurality of first pad regions), and a first edge region ER1.

The sensor array region SAR may include a region corresponding to the APS of FIG. 1. For example, a plurality of unit pixels that are arranged two-dimensionally (e.g., in a matrix) may be formed on a plane including first and second directions X and Y, in the sensor array region SAR. Each of the unit pixels may include a photoelectric conversion layer. This will be described later with reference to FIGS. 3 through 5.

The first connecting region CR1 may be disposed around the sensor array region SAR (e.g., outside the sensor array region SAR to be either partly or fully around the sensor array region SAR). In some embodiments, the first connecting region CR1 may electrically connect the sensor array region SAR of the first substrate structure 100 to the second substrate structure 200. The connecting region CR1 may refer to a collective connecting region, for example, extending around two sides of the sensor array region, or as one of a plurality of connecting regions (e.g., one region formed along a straight line).

The first pad regions PR1 may be disposed around the sensor array region SAR (e.g., outside the sensor array region SAR to be either partly or fully around the sensor array region SAR). The first pad regions PR1 may be connected to external devices and may be configured to transmit electrical signals between the image sensor and the external devices, according to some embodiments of the present disclosure. The first pad regions PR1 may be described as separate pad regions (e.g., each one associated with a single pad), or may be described as one or more group pad regions, (e.g., each one including a group of pads, for example formed along a straight line).

FIG. 2 illustrates that a first connecting region CR1 is interposed between the sensor array region SAR and the first pad regions PR1, but the present disclosure is not limited thereto. The arrangement of the sensor array region SAR, the first connecting region CR1, and the first pad regions PR1 may have one of various desired arrangements with respect to one another.

The first edge region ER1 may be disposed adjacent to the edges of the first substrate structure 100. For example, the first edge region ER1 may be disposed on the outside of the sensor array region SAR, the first connecting region CR1, and the first pad regions PR1. The first edge region may refer to a region adjacent a single edge of the first substrate structure 100, or regions adjacent to two or more edges of the first substrate structure 100.

In some embodiments, the second substrate structure 200 includes a logic circuit region LR, a second connecting region CR2, second pad regions PR2, and a second edge region ER2.

A plurality of electronic elements may be formed in the logic circuit region LR. The electronic elements may include, for example, transistors, but the present disclosure is not limited thereto. The logic circuit region LR may be electrically connected to the sensor array region SAR to transmit electrical signals to, or receive electrical signals from, the unit pixels in the sensor array region SAR. For example, the logic circuit region LR may include regions corresponding to the row decoder 20, the row driver 30, the column decoder 40, the timing generator 50, the CDS 60, the ADC 70, and the I/O buffer 80 of FIG. 1.

The second connecting region CR2 may be disposed around the logic circuit region LR. In some embodiments, the second connecting region CR2 may electrically connect the logic circuit region LR of the second substrate structure 200 to the first substrate structure 100. For example, the second connecting region CR2 may be electrically connected to the first connecting region CR1. Accordingly, the sensor array region SAR may be electrically connected to the logic circuit region LR and may thus transmit electrical signals to, or receive electrical signals from, the logic circuit region LR. The second connecting region CR2 may be formed in a region of the second substrate structure 200 corresponding to the first connecting region CR1, but the present disclosure is not limited thereto.

The second pad regions PR2 may be disposed around the logic circuit region LR. The second pad regions PR2 may be electrically connected to the first pad regions PR1, respectively. The second pad regions PR2 may be formed in regions of the second substrate structure 200 corresponding to the first pad regions PR1 (e.g., that overlap from a plan view), but the present disclosure is not limited thereto.

The second edge region ER2 may be disposed adjacent to the edges of the second substrate structure 200. For example, the second edge region ER2 may be disposed on the outside of the logic circuit region LR, the second connecting regions CR2, and the second pad regions PR2.

Figure 3:
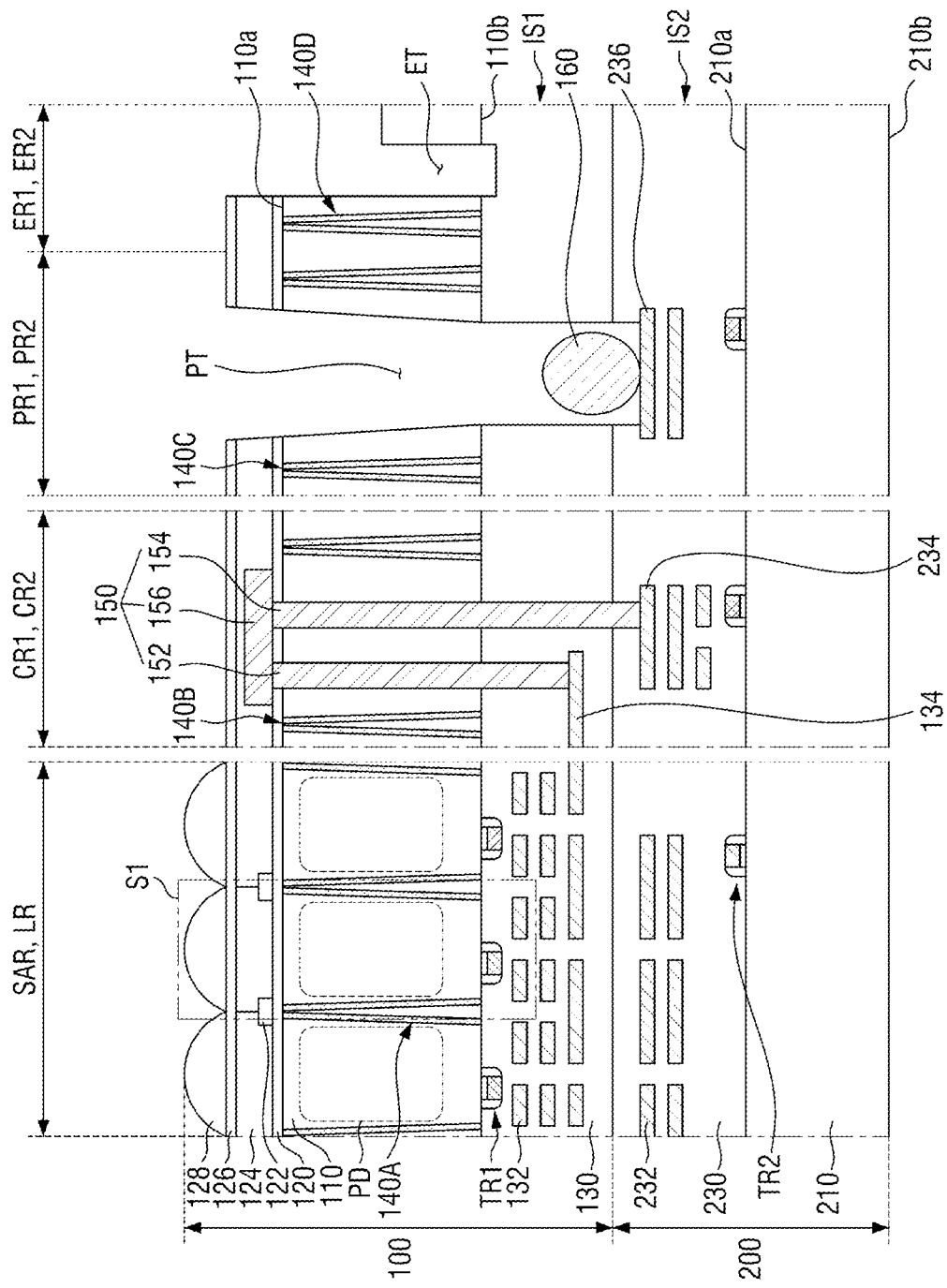
FIG. 3 is a cross-sectional view of an image sensor according to some embodiments of the present disclosure.
Figure 4:
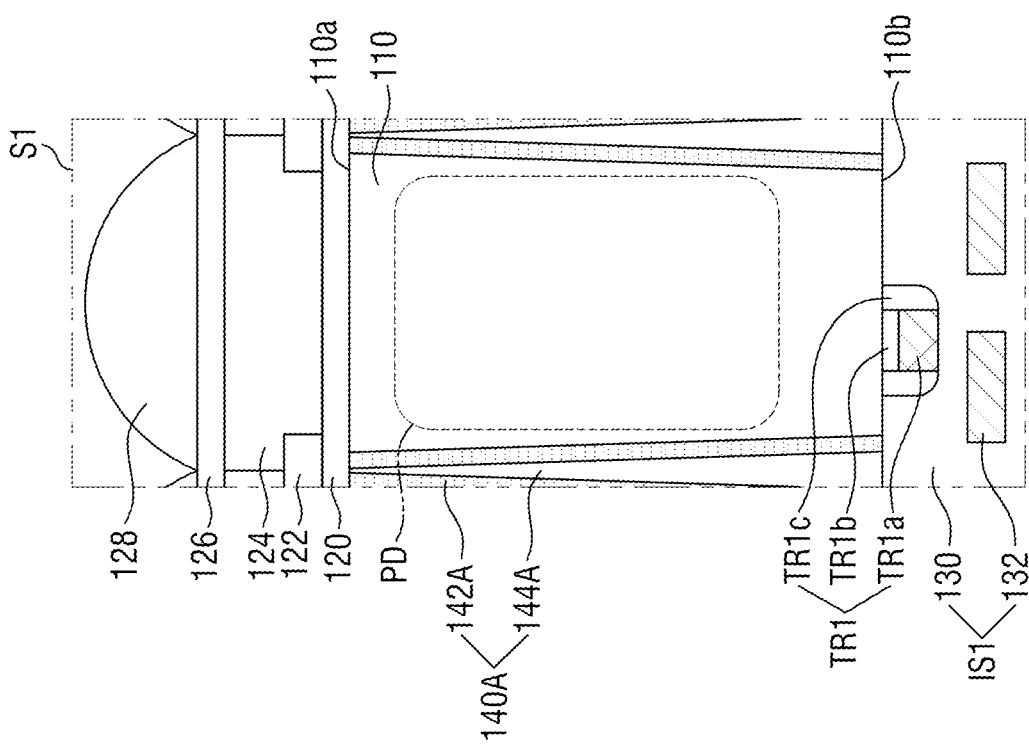
FIG. 4 is a partial enlarged cross-sectional view illustrating a region Si of FIG. 3.
Figure 5:
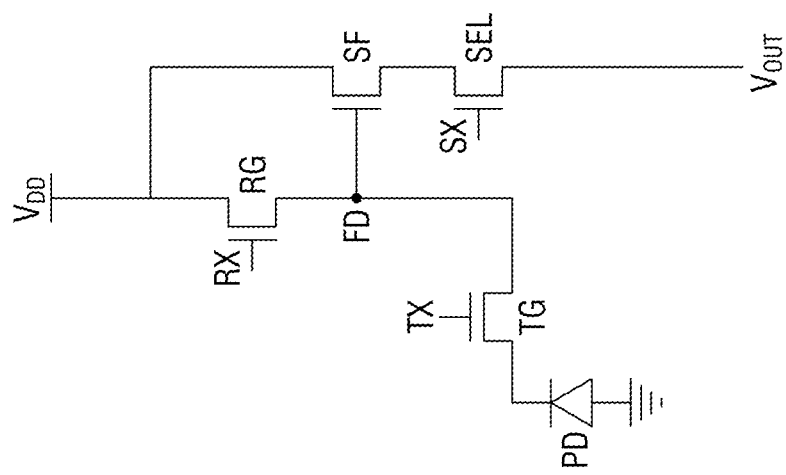
FIG. 5 is a circuit diagram illustrating a unit pixel of FIG. 3, according to some embodiments of the present disclosure.
Figure 6:
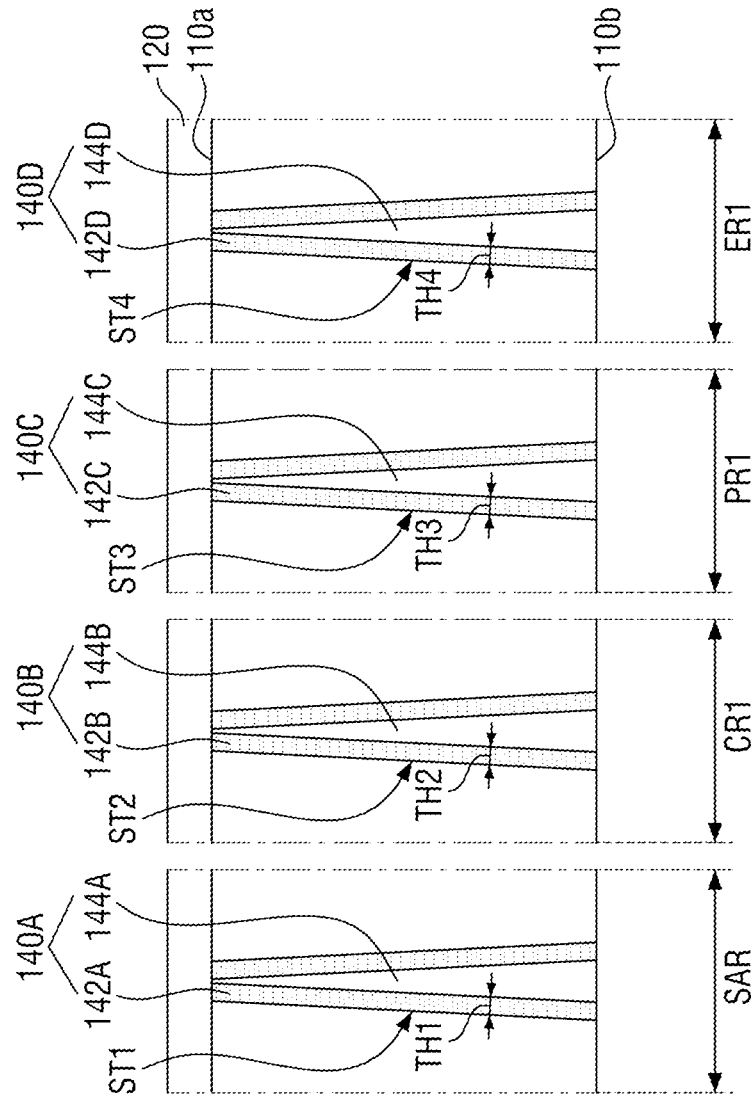
FIGS. 6 and 7 are partial enlarged cross-sectional views illustrating first, second, third, and fourth isolation films of FIG. 3.
Figure 7:
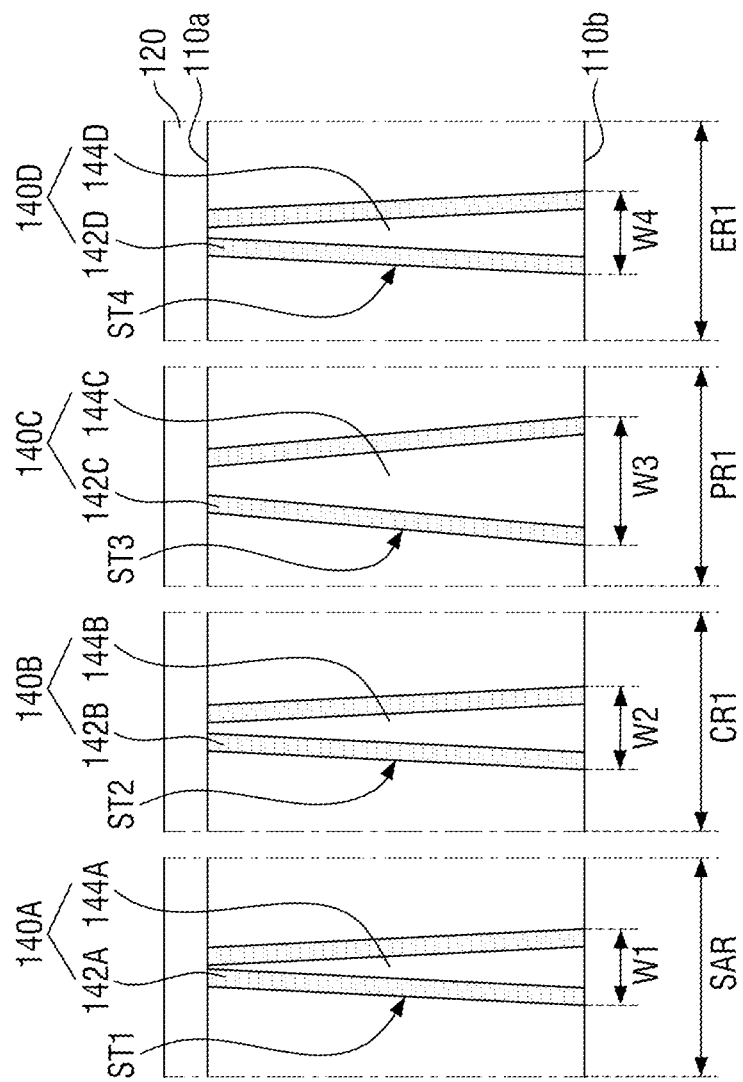

FIG. 3 is a cross-sectional view of an image sensor according to some embodiments of the present disclosure. FIG. 4 is a partial enlarged cross-sectional view illustrating a region Si of FIG. 3. FIG. 5 is a circuit diagram illustrating a unit pixel of FIG. 3. FIGS. 6 and 7 are partial enlarged cross-sectional views illustrating first, second, third, and fourth isolation films of FIG. 3. For convenience, descriptions of elements or features that have already been described above with reference to FIGS. 1 and 2 will be omitted, or at least simplified.

Referring to FIGS. 3 through 7, the image sensor according to some embodiments of the present disclosure includes a first substrate 110, a first wiring structure IS1, a second substrate 210, a second wiring structure IS2, a connecting structure 150, a ball bonding terminal 160, and first, second, third, and fourth isolation film 140A, 140B, 140C, and 140D.

The image sensor according to some embodiments of the present disclosure may include a sensor array region SAR, a logic circuit region LR, a connecting region (CR1 or CR2), a pad region (PR1 or PR2), and an edge region (ER1 or ER2). For example, the sensor array region SAR of the first substrate structure 100 may correspond to the sensor array region SAR of FIG. 2, and the logic circuit region LR of the second substrate structure 200 may correspond to the logic circuit region LR of FIG. 2.

The first substrate 110 and the first wiring structure IS1 may form the first substrate structure 100, and the second substrate 210 and the second wiring structure IS2 may form the second substrate structure 200.

The first substrate 110 may be a semiconductor substrate. For example, the first substrate 110 may be a bulk silicon substrate or a silicon-on-insulator (SOI) substrate. Alternatively, the first substrate 110 may be a silicon substrate or may include a material other than silicon, such as, for example, silicon germanium, indium antimonide, a lead tellurium compound, indium arsenide, indium phosphide, gallium arsenide, or gallium antimonide. In other embodiments, the first substrate 110 may be a base substrate having an epitaxial layer formed thereon.

The first substrate 110 may include first and second surfaces 110a and 110b, which are opposite to each other. The first surface 110a may be the rear side of the first substrate 110, and the second surface 110b may be the front side of the first substrate 110. In some embodiments, the first surface 110a of the first substrate 110 may be a light-receiving surface upon which light is received. For example, the image sensor according to some embodiments of the present disclosure may be a backside illumination (BSI) image sensor.

The first substrate 110 may include a plurality of unit pixels in the sensor array region SAR. For example, as illustrated in FIG. 4, each of the unit pixels may include a photoelectric conversion layer PD, a first transistor TR1, the first isolation film 140A, a first planarization layer 120, a color filter 124, a grid pattern 122, a second planarization layer 126, and a microlens 128.

Photoelectric conversion layers PD may be formed in the first substrate 110 in the sensor array region SAR. The photoelectric conversion layers PD may generate charge in proportion to the amount of light incident thereupon from the outside.

The photoelectric conversion layers PD may include, for example, photodiodes, phototransistors, photogates, pinned photodiodes, organic photodiodes, quantum dots, or combinations thereof, but the present disclosure is not limited thereto.

First transistors TR1 may be formed on the second surface 110b of the first substrate 110. The first transistors TR1 may be connected to the photoelectric conversion layers PD to form various transistors for processing electrical signals. For example, the first transistors TR1 may form various transistors (TG, RG, SF, and SEL) of FIG. 5 that will be described later.

In some embodiments, the first transistors TR1 may be metal-oxide semiconductor (MOS) transistors. For example, each of the first transistors TR1 may include a gate electrode TR1*a*, a gate dielectric film TR1*b*, and gate spacers TR1*c*. The gate dielectric film TR1*b* may be interposed between the gate electrode TR1*a* and the first substrate 110. The gate spacers TR1*c* may extend along the sides of the gate electrode TR1*a*.

The first isolation film 140A may be formed in the first substrate 110 in the sensor array region SAR. The first isolation film 140A may be formed by forming deep trenches (e.g., a first substrate trench ST1 of FIG. 6) through the patterning of the first substrate 110 and burying each of the deep trenches with an insulating material. In some embodiments, the first isolation film 140A may define each of the unit pixels in the sensor array region SAR. For example, the first isolation film 140A may be formed to surround each of the unit pixels in a plan view.

The width of the first isolation film 140A may decrease in a direction from the second surface 110*b* to the first surface 110*a*. Here, the term "width", as used herein, means the width in a direction parallel to the first and second surfaces 110*a* and 110*b* of the first substrate 110 (e.g., the width in the first or second direction X or Y). For example, the first isolation film 140A may have a tapered shape that narrows in a direction from the second surface 110*b* to the first surface 110*a* (e.g., in a third direction Z).

In some embodiments, the first isolation film 140A may penetrate the first substrate 110. For example, the first isolation film 140A may extend from the first surface 110*a* to the second surface 110*b* to penetrate through the entire first substrate 110.

In some embodiments, the first isolation film 140A may include a first oxide film 142A having a lower refractive index than the first substrate 110. The first oxide film 142A may include, for example, silicon oxide, aluminum oxide, tantalum oxide, or a combination thereof, but the present disclosure is not limited thereto.

The first oxide film 142A may be formed to a predetermined thickness (e.g., to have a predetermined thickness in the X or Y direction). For example, the first isolation film 140A may include the first oxide film 142A, which is formed to a predetermined thickness, and a first filling film 144A (also described as first filler), which is formed on the first oxide film 142A. The first filling film 144A may include, for example, polysilicon, but the present disclosure is not limited thereto.

For example, as illustrated in FIG. 6, a first substrate trench ST1 may be formed in the first substrate 110. The first oxide film 142A may extend along the profile of the first substrate trench ST1 (e.g., along sidewalls of the first substrate trench ST1). The first filling film 144A may be formed on the first oxide film 142A, so that the combined first filling film 144A and first oxide film 142A fill the first substrate trench ST1. In some embodiments, a thickness TH1 of the first oxide film 142A (e.g., in the X or Y direction) is about 10 nm or greater (e.g., at least 10 nm, or within a range from 10 nm to 100 nm).

The first oxide film 142A, which has a lower refractive index than the first substrate 110, may be formed to a predetermined thickness and may thus refract or reflect light incident diagonally upon the photoelectric conversion layers PD. Also, the first oxide film 142A may prevent photocharges generated in each of the unit pixels by incident light from moving to other neighboring unit pixels due to random drift. The first isolation film 140A may improve the quality of the image sensor according to some embodiments of the present disclosure by improving the light-receiving efficiency of the photoelectric conversion layers PD.

The first planarization layer 120 may be formed on the first surface 110*a* of the first substrate 110. The first planarization layer 120 may cover the first surface 110*a* of the first substrate 110. The first planarization layer 120 may include an insulating material. For example, the first planarization layer 120 may include silicon oxide, but the present disclosure is not limited thereto. In the image sensor according to some embodiments of the present disclosure, the first planarization layer 120 may be in contact with the first, second, third, and fourth filling films 144A, 144B, 144C, and 144D. The term "contact" or "in contact with," as used herein, refers to a direct connection (i.e., touching), unless the context clearly indicates otherwise. On the other hand, an element is referred to as being "connected" or "coupled" to or "on" another element can be directly connected or coupled to or on the other element or intervening elements may be present.

Color filters 124 may be formed on the first planarization layer 120 in the sensor array region SAR. The color filters 124 may be arranged to correspond to their respective unit pixels. For example, the color filters 124 may be arranged two dimensionally (e.g., in a matrix) on the plane including the first and second directions X and Y.

In some embodiments, the color filters 124 may include red, green, and blue filters. In some embodiments, the color filters 124 may include yellow, magenta, and cyan filters and may further include a white filter.

Grid patterns 122 may be formed in a grid shape on the first surface 110*a* of the first substrate 110 to surround their respective unit pixels (e.g., from a plan view). For example, the grid patterns 122 may be formed on the first planarization layer 120 and may be interposed between the color filters 124. The grid patterns 122 may be formed of a reflective material, or may be coated with a reflective material, may reflect light incident diagonally upon the first substrate 110 and may thus provide a considerable amount of incident light to the photoelectric conversion layers PD.

The second planarization layer 126 may be formed on the color filters 124. The second planarization layer 126 may cover the color filters 124. The second planarization layer 126 may include an insulating material. For example, the second planarization layer 126 may include silicon oxide, but the present disclosure is not limited thereto.

Microlenses 128 may be disposed on the second planarization layer 126. The microlenses 128 may be arranged to correspond to their respective unit pixels. For example, the microlenses 128 may be arranged two-dimensionally (e.g., in a matrix) on the plane including the first and second directions X and Y.

The microlenses 128 may have a convex shape and may have a predetermined radius of curvature. Accordingly, the microlenses 128 may concentrate incident light on the photoelectric conversion layers PD. The microlenses 128 may include, for example, a light-transmitting resin, but the present disclosure is not limited thereto.

The unit pixels in the sensor array region SAR may receive light and may convert an optical signal into an electrical signal. For example, as illustrated in FIG. 5, a unit pixel in the sensor array region SAR may include a photoelectric conversion layer PD, a transmission transistor TG, a floating diffusion region FD, a reset transistor RG, a source follower transistor SF, and a selection transistor SEL.

The photoelectric conversion layer PD may generate charge in proportion to the amount of light incident thereupon from the outside. The photoelectric conversion layer PD may be coupled to the transmission transistor TG, which transmits the charge generated by the photoelectric conversion layer to the floating diffusion region FD. The floating diffusion region FD, which is a region that converts charge into a voltage, has parasitic capacitance and can thus accumulatively store charge therein.

One end of the transmission transistor TG may be connected to the photoelectric conversion layer PD, and the other end of the transmission transistor TG may be connected to the floating diffusion region FD. The transmission transistor TG may be formed as a transistor that can be driven by a predetermined bias (e.g., a transmission signal TX). For example, the transmission transistor TG may transmit the charge generated by the photoelectric conversion layer PD to the floating diffusion region FD in accordance with the transmission signal TX.

The source follower transistor SF may amplify a change in the electrical potential of the floating diffusion region FD, which receives charge from the photoelectric conversion layer PD, and may output the result of the amplification to an output line $V_{OUT}$. If the source follower transistor SF is turned on, a predetermined electrical potential provided to the drain of the source follower transistor SF, for example, a power supply voltage $V_{DD}$, may be transmitted to the drain region of the selection transistor SEL.

The selection transistor SEL may select a row of unit pixels to be read. The selection transistor SEL may consist of a transistor that can be driven by a selection line that applies a predetermined bias (e.g., a row selection signal SX).

The reset transistor RG may periodically reset the floating diffusion region FD. The reset transistor RG may consist of a transistor that can be driven by a reset line that applies a predetermined bias (e.g., a reset signal RX). If the reset transistor RG is turned on by the reset signal RX, a predetermined electrical potential provided to the drain of the reset transistor RG, for example, the power supply voltage $V_{DD}$, may be transmitted to the floating diffusion region FD.

Referring again to FIG. 3, the first wiring structure IS1 may be formed on the second surface 110b of the first substrate 110. The first wiring structure IS1 may cover the second surface 110b of the first substrate 110.

The first wiring structure IS1 may consist of one or multiple wirings. For example, the first wiring structure IS1 may include a first interlayer insulating film 130 and a plurality of wirings (132 and 134) in the first interlayer insulating film 130. The number and the arrangement of layers of wiring that form the first wiring structure IS1 of FIG. 3 are exemplary and may vary. The first interlayer insulating film 130 may include at least one of, for example, silicon oxide, silicon nitride, silicon oxynitride, and a low-k material having a lower dielectric constant than silicon oxide, but the present disclosure is not limited thereto.

In some embodiments, the first wiring structure IS1 may include first wiring 132 in the sensor array region SAR and second wiring 134 in a first connecting region CR1. The first wiring 132 may be electrically connected to the unit pixels in the sensor array region SAR. For example, the first wiring 132 may be connected to the first transistors TR1. The second wiring 134 may extend from the sensor array region SAR. For example, the second wiring 134 may be formed in both the sensor array region SAR and the connecting region CR1 or CR2 and may extend from the sensor array region SAR to the connecting region CR1 or CR2. The second wiring 134 may be electrically connected to at least some of the first wiring 132. Accordingly, the second wiring 134 may be electrically connected to the unit pixels in the sensor array region SAR.

The first and second wirings 132 and 134 may include at least one of, for example, tungsten (W), copper (Cu), aluminum (Al), gold (Au), silver (Ag), and an alloy thereof, but the present disclosure is not limited thereto.

The second substrate 210 may be a bulk silicon substrate or an SOI substrate. Alternatively, the second substrate 210 may be a silicon substrate or may include a material other than silicon, such as, for example, silicon germanium, indium antimonide, a lead tellurium compound, indium arsenide, indium phosphide, gallium arsenide, or gallium antimonide. In some embodiments, the second substrate 210 may be a base substrate having an epitaxial layer formed thereon.

The second substrate 210 may include third and fourth surfaces 210a and 210b that are opposite to each other. In some embodiments, the third surface 210a of the second substrate 210 may face the second surface 110b of the first substrate 110.

A plurality of electronic elements may be formed on the second substrate 210. For example, second transistors TR2 may be formed on the third surface 210a of the second substrate 210. The second transistors TR2 may form, for example, the logic circuit region LR of FIG. 2.

The second wiring structure IS2 may be formed on the third surface 210a of the second substrate 210. The second wiring structure IS2 may cover the third surface 210a of the second substrate 210.

The second wiring structure IS2 may be attached to the first wiring structure IS1. For example, as illustrated in FIG. 3, the top surface of the second wiring structure IS2 may be attached to the bottom surface of the first wiring structure IS1.

The second wiring structure IS2 may consist of one or multiple wirings. For example, the second wiring structure IS2 may include a second interlayer insulating film 230 and a plurality of wirings (232, 234, and 236) in the second interlayer insulating film 230. The number and the arrangement of layers of wiring that form the second wiring structure IS2 of FIG. 3 are exemplary and may vary. The second wiring structure IS2 may include at least one of, for example, silicon oxide, silicon nitride, silicon oxynitride, and a low-k material having a lower dielectric constant than silicon oxide, but the present disclosure is not limited thereto. In some embodiments, the second wiring structure IS2 may include the same material as the first wiring structure IS1.

At least some of the wiring (232, 234, and 236) of the second wiring structure IS2 may be electrically connected to the logic circuit region LR. For example, at least some of the wiring (232, 234, and 236) of the second wiring structure IS2 may be connected to the second transistors TR2.

In some embodiments, the second wiring structure IS2 may include third wiring 232 in the logic circuit region LR, fourth wiring 234 in a second connecting region CR2, and fifth wiring 236 in a second pad region PR2. In some embodiments, the fourth wiring 234 may be the uppermost wiring in the second connecting region CR2, and the fifth wiring 236 may be the uppermost wiring in the second pad region PR2.

The third, fourth, and fifth wirings 232, 234, and 236 may include at least one of, for example, W, Cu, Al, Au, Ag, and an alloy thereof, but the present disclosure is not limited thereto.

The connecting structure 150 may be formed in the connecting region (CR1 or CR2). The connecting structure 150 may electrically connect the first and second wiring structures IS1 and SI2. For example, the connecting structure 150 may connect the second and fourth wirings 134 and 234 through the first substrate 110. Accordingly, the second transistors TR2 may be electrically connected to the sensor array region SAR and may thus transmit electrical signals to, and receive electrical signals from, the unit pixels in the sensor array region SAR.

In some embodiments, the connecting structure 150 includes a first through via 152, a second through via 154, and connecting wiring 156. The first through via 152 may be connected to the wiring of the first wiring structure IS1 (e.g., the second wiring 134) through the first substrate 110. The second through via 154 may be connected to the wiring of the second wiring structure IS2 (e.g., the fourth wiring 234) through the first substrate 110. The connecting wiring 156 may be formed on the first surface 110a of the first substrate 110 to connect the first and second through vias 152 and 154. Accordingly, the second and fourth wirings 134 and 234 may be connected. The first and second through vias 152 and 154 may be formed of conductive material, and may be referred to as conductive through vias.

FIG. 3 illustrates that the widths of the first and second through vias 152 and 154 do not change in a direction from the second surface 110b to the first surface 110a (e.g., in the third direction Z), but the present disclosure is not limited thereto. For example, the first through via 152 and/or the second through via 154 may have a tapered shape depending on how the first through via 152 and/or the second through via 154 are formed.

In some embodiments, the connecting wiring 156 may be formed on the first planarization layer 120. For example, the connecting wiring 156 may extend along part of the top surface of the first planarization layer 120, and the first and second through vias 152 and 154 may be connected to the connecting wiring 156 through the first planarization layer 120 (e.g., by physically passing through the first planarization layer 120).

The second isolation film 140B may be formed in the first substrate 110 in the connecting region (CR1 or CR2). The second isolation film 140B may be formed by forming deep trenches (e.g., a second substrate trench ST2 of FIG. 6) through the patterning of the first substrate 110 and burying each of the deep trenches with an insulating material.

The second isolation film 140B may be disposed adjacent to the connecting structure 150. For example, the second isolation film 140B may be formed on the sides of the connecting structure 150. The second isolation film 140B may electrically isolate the connecting structure 150 from the first substrate 110 in the sensor array region SAR. For example, the second isolation film 140B may be interposed between the sensor array region SAR and the connecting structure 150, in a horizontal direction.

In some embodiments, the second isolation film 140B may surround the sides of the connecting structure 150. Accordingly, the second isolation film 140B may electrically isolate the connecting structure 150 within the first substrate 110.

The ball bonding terminal 160 may be formed in the pad region (PR1 or PR2). The ball bonding terminal 160 may be connected to an external device and may be configured to transmit electrical signals between the image sensor according to some embodiments of the present disclosure and the external device (e.g., a device external to the image sensor). For example, the ball bonding terminal 160 may be connected to an external device via wiring (not illustrated), but the present disclosure is not limited thereto.

In some embodiments, the ball bonding terminal 160 may be electrically connected to the second wiring structure IS2.

For example, a pad trench PT may be formed in the pad region (PR1 or PR2) to expose the fifth wiring 236 through the first substrate 110. The pad trench PT may expose the fifth wiring 236 through, for example, the second planarization layer 126, the first planarization layer 120, the first substrate 110, and the first wiring structure IS1. The ball bonding terminal 160 may be formed in the pad trench PT to be connected to the top surface of the fifth wiring 236. The ball bonding terminal 160 may include a ball portion and a pad portion (not shown), and may be generally referred to as a bonding terminal. Alternatively, the ball bonding terminal 160 may include just a ball portion, and the fifth wiring 236 may serve as a bonding pad (and may be referred to as a pad) for the ball bonding terminal 160.

The ball bonding terminal 160 may include at least one of, for example, W, Cu, Al, Au, Ag, and an alloy thereof (e.g., in the pad portion; the ball portion may include a solder material, for example)), but the present disclosure is not limited thereto. In one embodiment, ball bonding terminal 160 may have a shape of a ball or bump, and may be described as a ball bonding pad.

The third isolation film 140C may be formed in the first substrate 110 in the pad region (PR1 or PR2). The third isolation film 140C may be formed by forming deep trenches (e.g., a third substrate trench ST3 of FIG. 6) through the patterning of the first substrate 110 and burying each of the deep trenches with an insulating material.

The third isolation film 140C may be disposed adjacent to the pad trench PT. For example, the third isolation film 140C may be formed on the sides of the pad trench PT. The third isolation film 140C may electrically isolate the ball bonding terminal 160, which is formed in the pad trench PT, from the first substrate 110 in the sensor array region SAR. For example, the third isolation film 140C may be interposed between the sensor array region SAR and the ball bonding terminal 160.

In some embodiments, the third isolation film 140C may surround the sides of the pad trench PT. Accordingly, the third isolation film 140C may electrically isolate the ball bonding terminal 160, which is formed in the pad trench PT, within the first substrate 110.

The fourth isolation film 140D may be formed in the first substrate 110 in the edge region (ER1 or ER2). The fourth isolation film 140D may be formed by forming deep trenches (e.g., a fourth substrate trench ST4 of FIG. 6) through the patterning of the first substrate 110 and burying each of the deep trenches with an insulating material.

The fourth isolation film 140D can improve the durability of the image sensor according to some embodiments of the present disclosure by preventing the propagation of cracks from the edges of the image sensor according to some embodiments of the present disclosure.

In some embodiments, an edge trench ET may be formed in the first substrate 110 in the edge region (ER1 or ER2). The edge trench ET is illustrated as penetrating the first substrate 110, but the present disclosure is not limited thereto. For example, the depth of the edge trench ET in the first substrate 110 may be one of various desired depths.

In some embodiments, the fourth isolation film 140D may be interposed between the sensor array region SAR and the edge trench ET.

In the image sensor according to some embodiments of the present disclosure, the second, third, and fourth isolation films 140B, 140C, and 140D may be formed at the same level as the first isolation film 140A. The expression "one element being formed at the same level as another element", as used herein, means that the two elements are formed by the same manufacturing process (i.e., at the same time). By being formed at the same level, the first to fourth isolation films 140A-140D may be disposed at the same vertical height from the third surface 210a of the second substrate 210, and may each have the same top and bottom heights.

For example, as illustrated in FIG. 6, the second isolation film 140B may include a second oxide film 142B and a second filling film 144B, the third isolation film 140C may include a third oxide film 142C and a third filling film 144C, and the fourth isolation film 140D may include a fourth oxide film 142D and a fourth filling film 144D.

In the image sensor according to some embodiments of the present disclosure, the first, second, third, and fourth isolation films 140A, 140B, 140C, and 140D does not protrude beyond the first surface 110a of the first substrate 110. However, in other embodiments, some of the first, second, third, and fourth isolation films 140A, 140B, 140C, and 140D (e.g., the first and second isolation films 140A and 140B in one embodiment), protrude beyond the first surface 110a of the first substrate 110.

In some embodiments, a thickness TH2 of the second oxide film 142B, a thickness TH3 of the third oxide film 142C, and a thickness TH4 of the fourth oxide film 142D (each thickness being in a horizontal direction parallel to the X or Y directions) may be the same as a thickness TH1 of the first oxide film 142A. Here, the thicknesses TH2, TH3, and TH4 may be completely the same as the thickness TH1 or may differ slightly from the thickness TH1 due to process margins. For example, the thicknesses TH1, TH2, TH3, and TH4 may each be 10 nm or greater (e.g., between 10 nm and 100 nm).

In some embodiments, a width W2 of the second isolation film 140B, a width W3 of the third isolation film 140C, and a width W4 of the fourth isolation film 140D may differ from a width W1 of the first isolation film 140A. Here, the term "width", as used herein, means the width in a direction parallel to the first and second surfaces 110a and 110b of the first substrate 110.

For example, as illustrated in FIG. 7, the widths W2, W3, and W4 may be greater than the width W1.

In some embodiments, the widths W2, W3, and W4 may differ from one another. FIG. 7 illustrates that the width W3 is greater than the widths W2 and W4, but the present disclosure is not limited thereto.

In some embodiments, the width W1 may be about 100 nm to about 300 nm.

Figure 8:
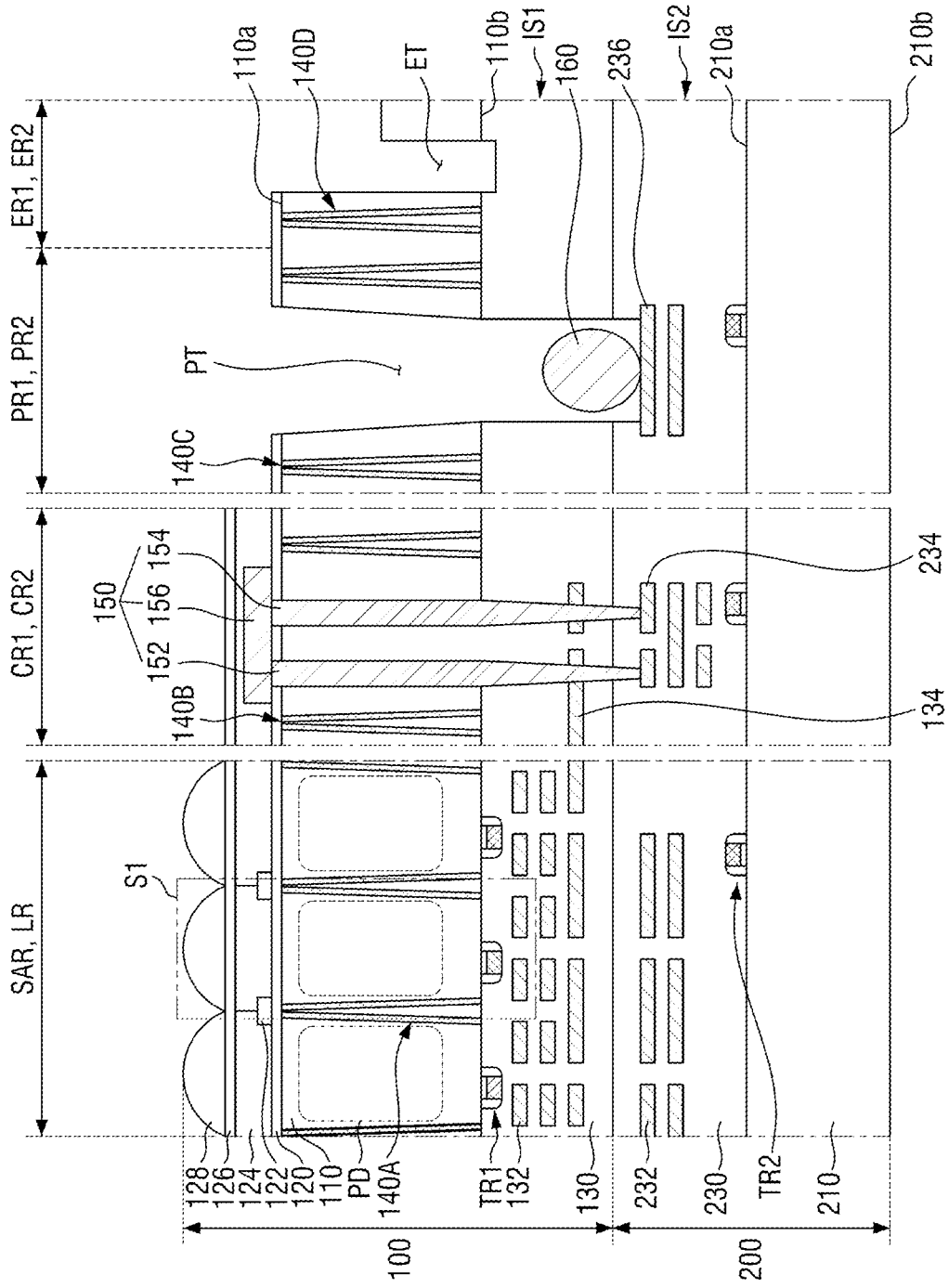
FIG. 8 is a cross-sectional view of an image sensor according to some embodiments of the present disclosure.

FIG. 8 is a cross-sectional view of an image sensor according to some embodiments of the present disclosure. For convenience, descriptions of elements or features that have already been described above with reference to FIGS. 1 through 7 will be omitted, or at least simplified.

Referring to FIG. 8, in the image sensor according to some embodiments of the present disclosure, a connecting structure 150 is connected to fourth wiring 234 through second wiring 134.

For example, first and second through vias 152 and 154 may be connected to the fourth wiring 234 through the second wiring 134. Accordingly, the second and fourth wirings 134 and 234 may be connected.

In some embodiments, the first through via 152 and/or the second through via 154 may have a tapered shape. For example, the width of the first through via 152, which penetrates first and second wiring structures IS1 and IS2, may decrease close to the fourth wiring 234 due to the characteristics of etching for forming the first through via 152. Similarly, for example, the width of the second through via 154, which penetrates the first and second wiring struc-tures IS1 and IS2, may decrease close to the fourth wiring 234 due to the characteristics of etching for forming the second through via 154. However, the present disclosure is not limited to these examples.

Figure 9:
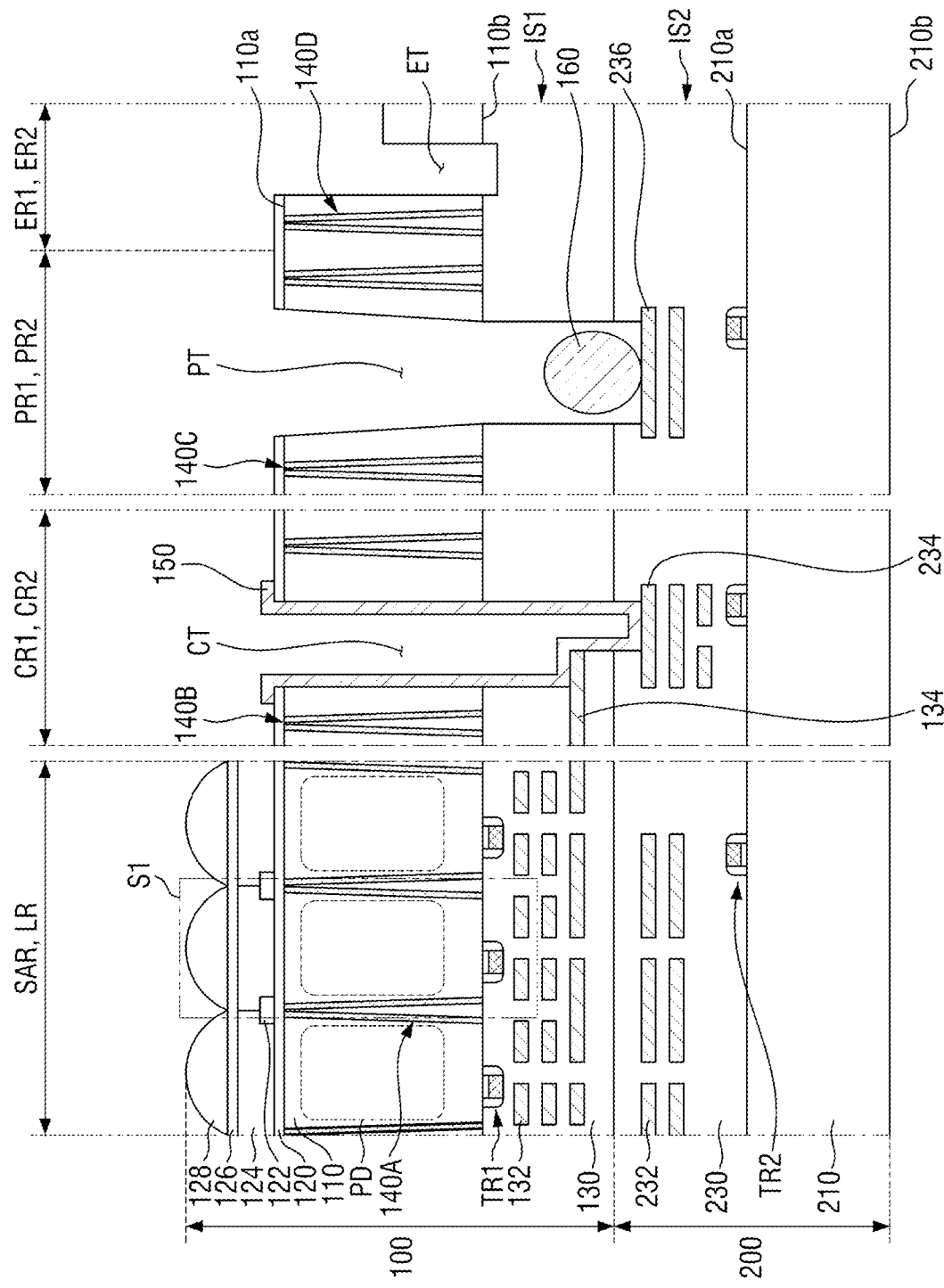
FIG. 9 is a cross-sectional view of an image sensor according to some embodiments of the present disclosure.

FIG. 9 is a cross-sectional view of an image sensor according to some embodiments of the present disclosure. For convenience, descriptions of elements or features that have already been described above with reference to FIGS. 1 through 7 will be omitted, or at least simplified.

Referring to FIG. 9, in the image sensor according to some embodiments of the present disclosure, a connecting structure 150 is formed in a connecting trench CT.

The connecting trench CT may expose both second wiring 134 and fourth wiring 234. For example, part of the connecting trench CT may expose the top surface of the second wiring 134 through a first substrate 110. Another part of the connecting trench CT may expose the top surface of the fourth wiring 234 through the first substrate 110 and a first wiring structure IS1.

In some embodiments, the connecting structure 150 may be formed in the connecting trench CT to connect the second and fourth wiring 134 and 234. The connecting structure 150 is illustrated as extending and being formed conformally along the profile of the connecting trench CT, but the present disclosure is not limited thereto. Alternatively, the connecting structure 150 may be formed to completely fill the connecting structure CT.

Figure 10:
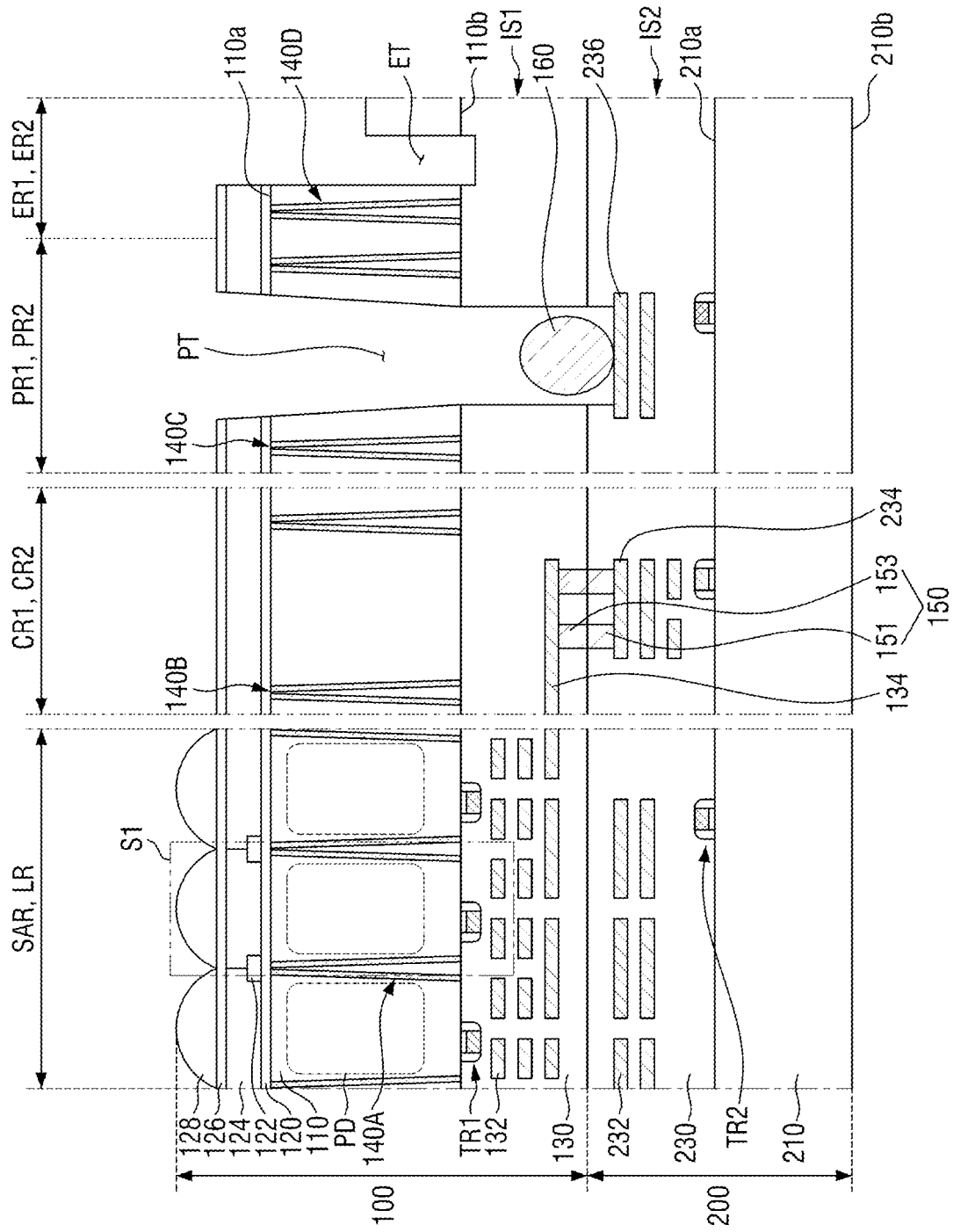
FIG. 10 is a cross-sectional view of an image sensor according to some embodiments of the present disclosure.

FIG. 10 is a cross-sectional view of an image sensor according to some embodiments of the present disclosure. For convenience, descriptions of elements or features that have already been described above with reference to FIGS. 1 through 7 will be omitted, or at least simplified.

Referring to FIG. 10, in the image sensor according to some embodiments of the present disclosure, a connecting structure 150 includes first and second pillars 151 and 153.

The first pillar 151 may be formed in a first wiring structure IS1. The first pillar 151 may be connected to second wiring 134 and may be exposed on the surface of the first wiring structure IS1. For example, the first pillar 151 may extend from the boundary between the first wiring structure IS1 and a second wiring structure IS2 to be connected to the bottom surface of the second wiring 134.

The second pillar 153 may be formed in the second wiring structure IS2. The second pillar 153 may be connected to the fourth wiring 234 and may be exposed on the surface of the second wiring structure IS2. For example, the second pillar 153 may extend from the boundary between the first wiring structure IS1 and a second wiring structure IS2 to be connected to the top surface of the fourth wiring 234.

In some embodiments, the first and second pillars 151 and 153 may be in contact with each other. For example, the bottom surface of the first pillar 151, exposed from the first wiring structure IS1, may be in contact with the top surface of the second pillar 153, exposed from the second wiring structure IS2. Accordingly, the second and fourth wirings 134 and 234 may be connected.

The first and second pillars 151 and 153 may have various pillar shapes such as, for example, a cylindrical shape, a truncated cone shape, a polygonal pillar shape, and a polygonal pyramid shape.

The first and second pillars 151 and 153 may include, for example, Cu, but the present disclosure is not limited thereto.

A method of fabricating an image sensor according to some embodiments of the present disclosure will hereinafter be described with reference to FIGS. 3 and 11 through 17.

FIGS. 11 through 17 are cross-sectional views illustrating a method of fabricating an image sensor according to some embodiments of the present disclosure. For convenience, descriptions of elements or features that have already been described above with reference to FIGS. 1 through 10 will be omitted, or at least simplified.

Figure 11:
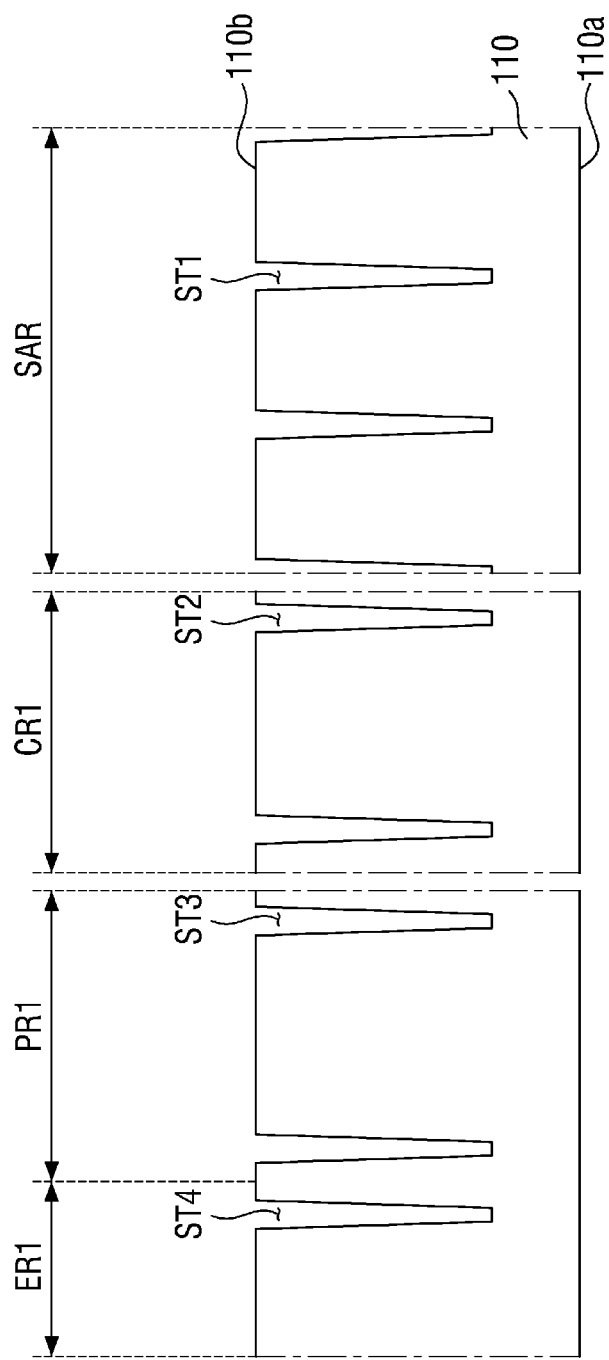
FIGS. 11 through 17 are cross-sectional views illustrating a method of fabricating an image sensor according to some embodiments of the present disclosure.

Referring to FIG. 11, first substrate trenches ST1, second substrate trenches ST2, third substrate trenches ST3, and fourth substrate trenches ST4 are formed in a first substrate 110.

The first substrate 110 may include a sensor array region SAR, a first connecting region CR1, a first pad region PR1, and a first edge region ER1. Photoelectric conversion layers PD may be formed in the first substrate 110 in the sensor array region SAR. The first substrate 110 may have first and second surfaces 110a and 110b, which are opposite to each other.

The first substrate trenches ST1 may be formed in the sensor array region SAR of the first substrate 110. The first substrate trenches ST1 may define regions in which to form the photoelectric conversion layers PD of FIG. 13.

The second substrate trenches ST2 may be formed in the first connecting region CR1 of the first substrate 110. The third substrate trenches ST3 may be formed in the first pad region PR1 of the first substrate 110. The fourth substrate trenches ST4 may be formed in the first edge region ER1 of the first substrate 110.

The first substrate trenches ST1, the second substrate trenches ST2, the third substrate trenches ST3, and the fourth substrate trenches ST4 may be formed by performing patterning (or etching) on the second surface 110b of the first substrate 110. Accordingly, the respective widths (e.g., in a horizontal direction, parallel to the first surface 110a and second surface 110b) of the first substrate trenches ST1, the second substrate trenches ST2, the third substrate trenches ST3, and the fourth substrate trenches ST4 may decrease in a direction from the second surface 110b to the first surface 110a.

The first substrate trenches ST1, the second substrate trenches ST2, the third substrate trenches ST3, and the fourth substrate trenches ST4 may be formed at the same level. For example, the first substrate trenches ST1, the second substrate trenches ST2, the third substrate trenches ST3, and the fourth substrate trenches ST4 may be formed by the same patterning (or etching) process.

Figure 12:
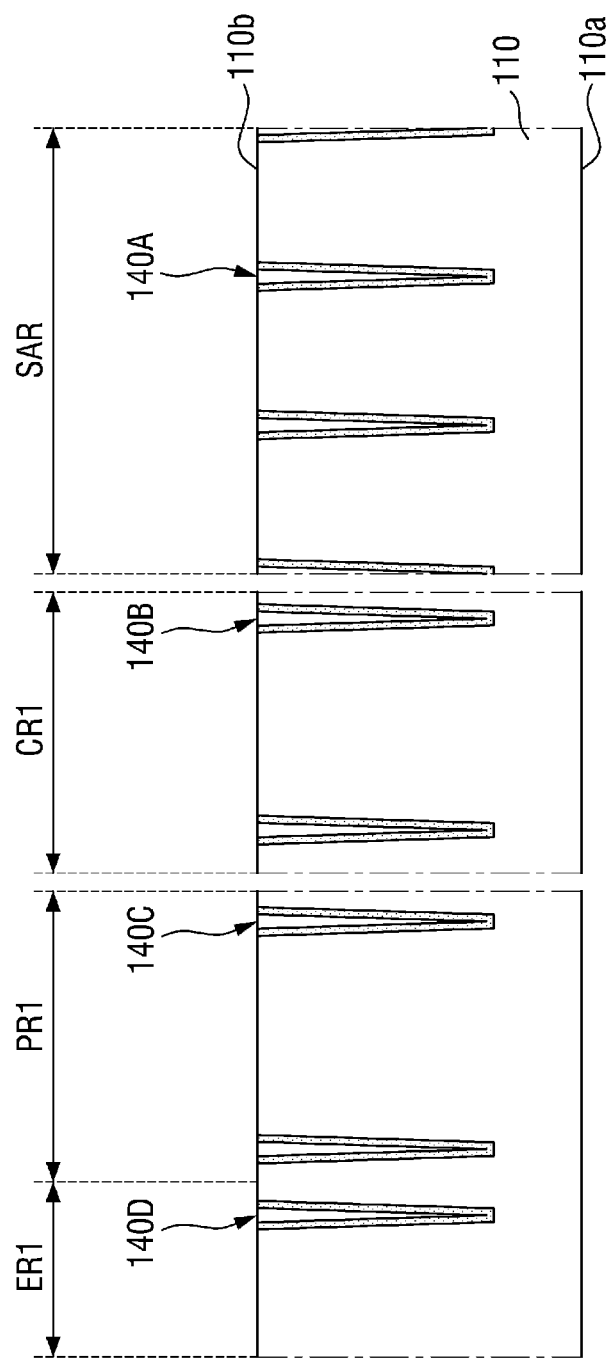

Referring to FIG. 12, first, second, third, and fourth isolation films 140A, 140B, 140C, and 140D may be formed in the first substrate trenches ST1, the second substrate trenches ST2, the third substrate trenches ST3, and the fourth substrate trenches ST4, respectively.

The first, second, third, and fourth isolation films 140A, 140B, 140C, and 140D may be formed by burying an insulating material in the first substrate trenches ST1, the second substrate trenches ST2, the third substrate trenches ST3, and the fourth substrate trenches ST4, respectively. In some embodiments, the first, second, third, and fourth isolation films 140A, 140B, 140C, and 140D may include the first, second, third, and fourth oxide films 142A, 142B, 142C, and 142D, respectively, as illustrated in FIG. 6.

The first isolation film 140A, which fills the first substrate trenches ST1, may define regions in which to form unit pixels in the sensor array region SAR.

Figure 13:
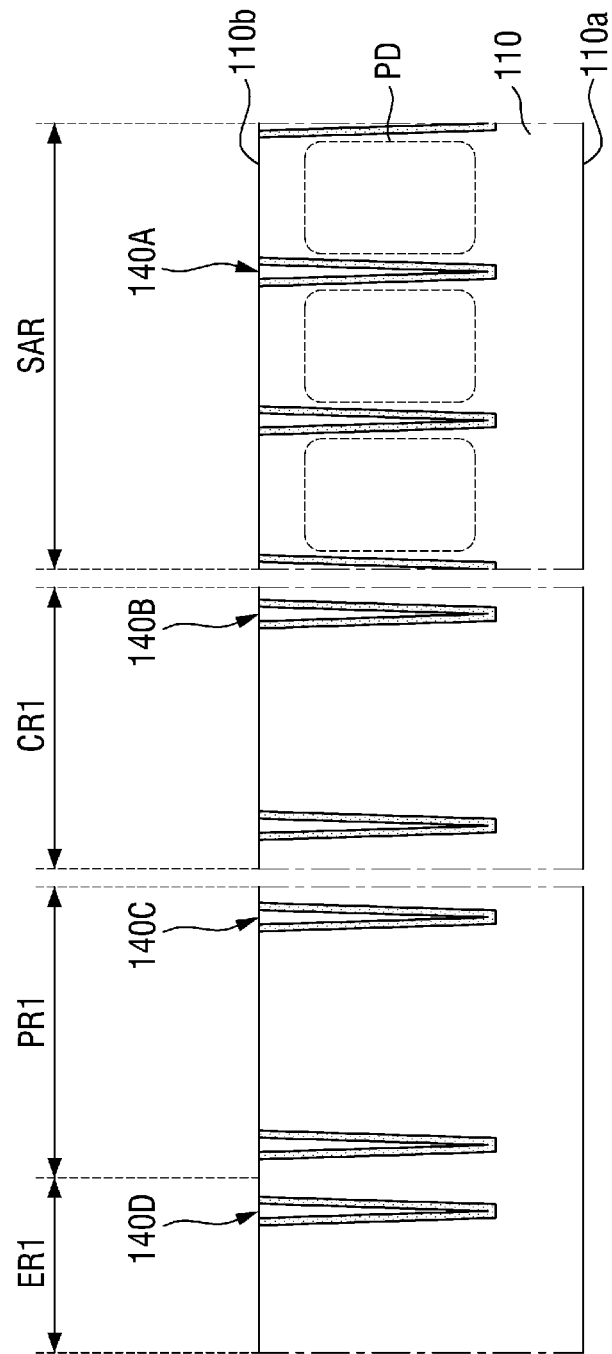

Referring to FIG. 13, the photoelectric conversion layers PD are formed in the sensor array region SAR of the first substrate 110. The photoelectric conversion layers PD may be formed in the first substrate 110.

Due to the first isolation film 140A, which fills the first substrate trenches ST1, the photoelectric conversion layers PD may be separated from one another. The first isolation film 140 may define each unit pixel in the sensor array region SAR. The first isolation film 140A may be formed to surround each unit pixel in a plan view.

Figure 14:
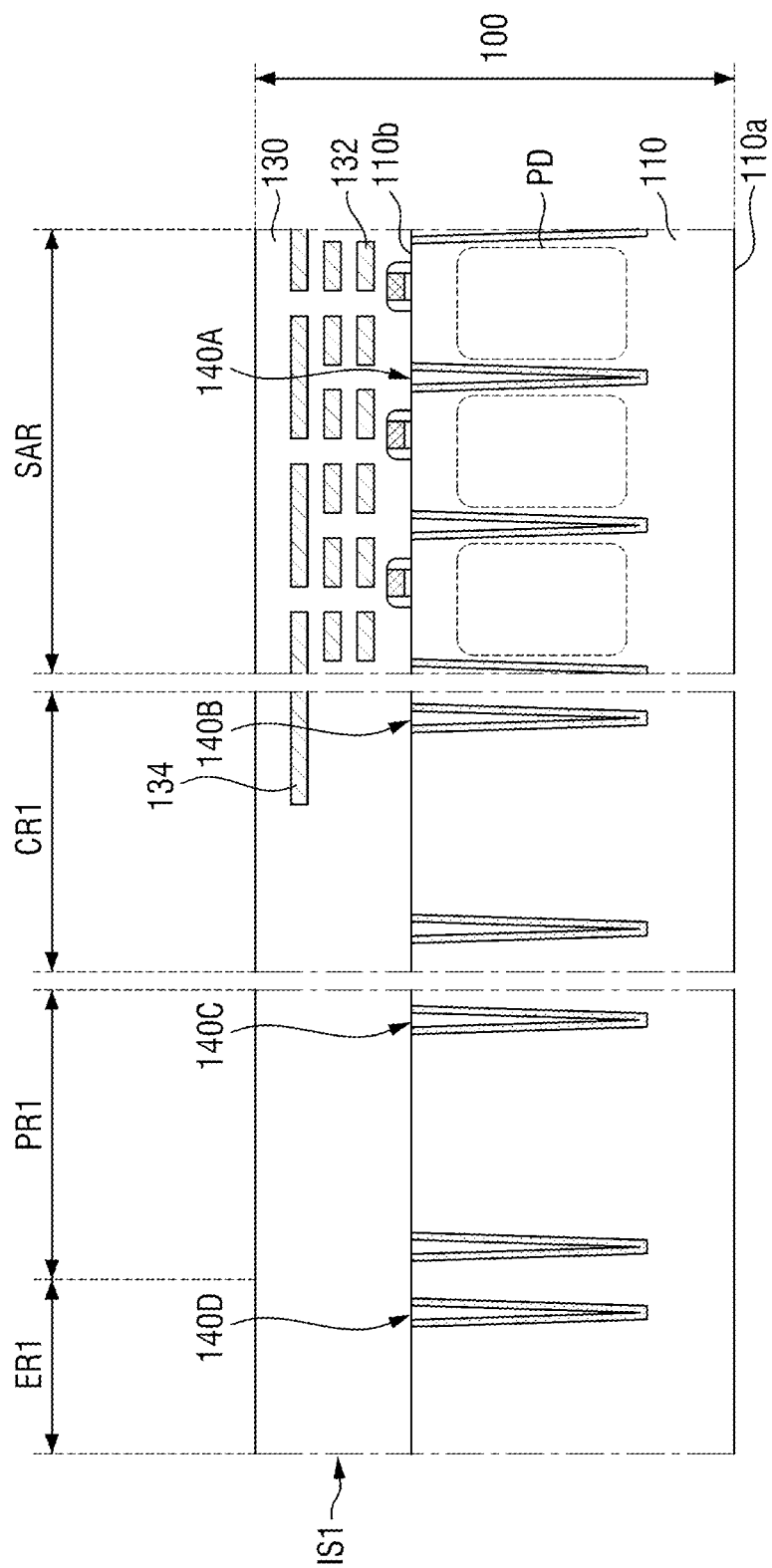

Referring to FIG. 14, first transistors TR1 and a first wiring structure IS1 are formed on the second surface 110b of the first substrate 110. As a result, a first substrate structure 100, including the first substrate 110, the first transistors TR1, and the first wiring structure IS1, are formed.

The first transistors TR1 may be connected to the photoelectric conversion layers PD to form various transistors for processing electrical signals.

The first wiring structure IS1 may include a first interlayer insulating film 130 and a plurality of wirings (132 and 134) in the first interlayer insulating film 130. For example, the first wiring structure IS1 may include first wiring 132 in the sensor array region SAR and a second wiring 134 in the first connecting region CR1.

Figure 15:
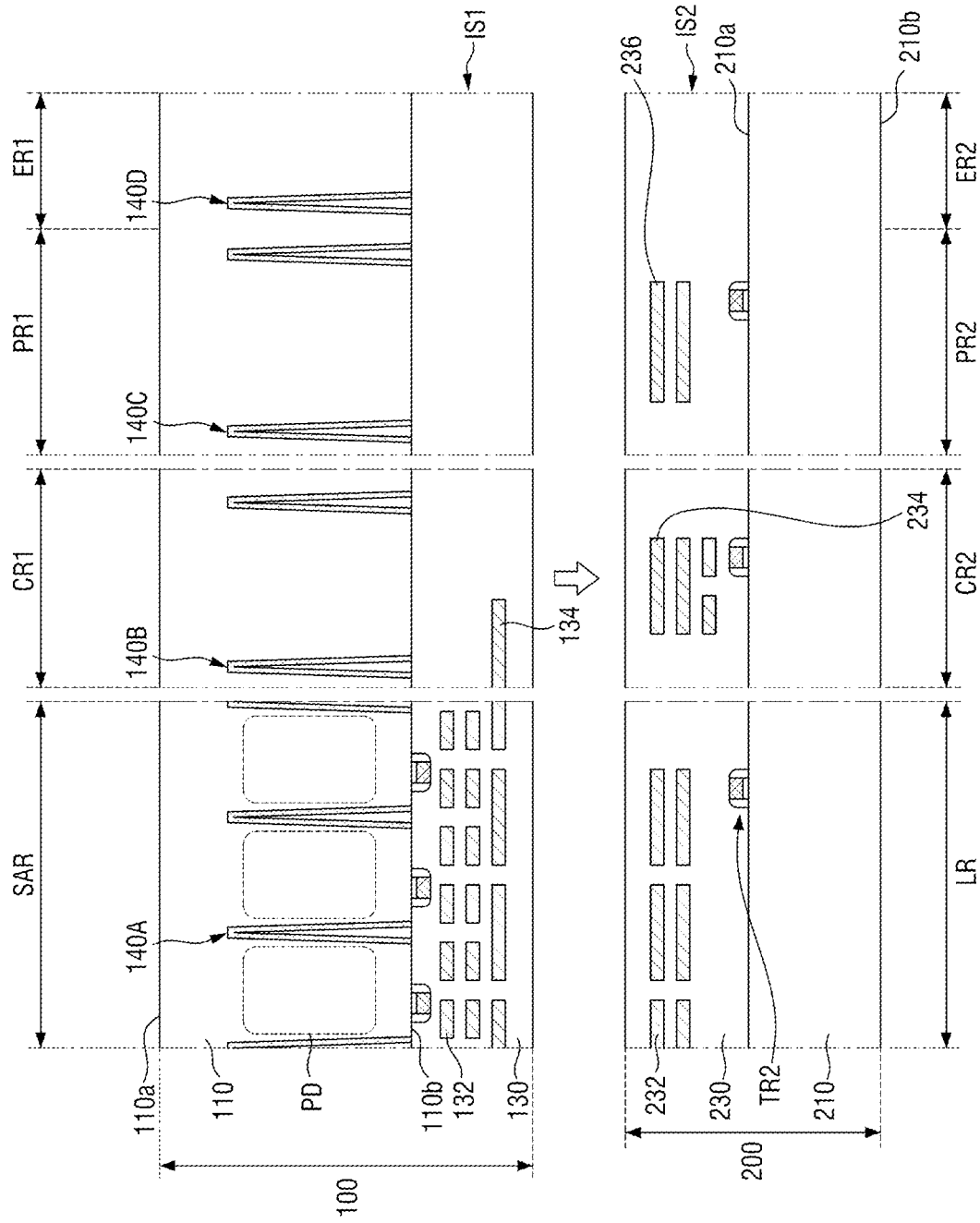

Referring to FIG. 15, the first substrate structure 100 is attached on a second substrate structure 200. To do so, in the manufacturing process, the first substrate structure 100 may be flipped so that the first wiring structure IS1 is below the first substrate 110.

The second substrate structure 200 may include a logic circuit region LR, a second connecting region CR2, a second pad region PR2, and a second edge region ER2. The second substrate structure 200 may further include a second substrate 210 and a second wiring structure IS2.

The second wiring structure IS2 may include a second interlayer insulating film 230 and a plurality of wirings (232, 234, and 236) in the second interlayer insulating film 230. For example, the second wiring structure IS2 may include third wiring 232 in the logic circuit region LR, fourth wiring 234 in the second connecting region CR2, and fifth wiring 236 in the second pad region PR2.

In some embodiments, the first and second substrate structures 100 and 200 may be attached so that the second surface 110b of the first substrate 110 and a third surface 210a of a second substrate 210 face each other. For example, the top surface of the second wiring structure IS2 may be attached onto the bottom surface of the first wiring structure IS1.

Figure 16:
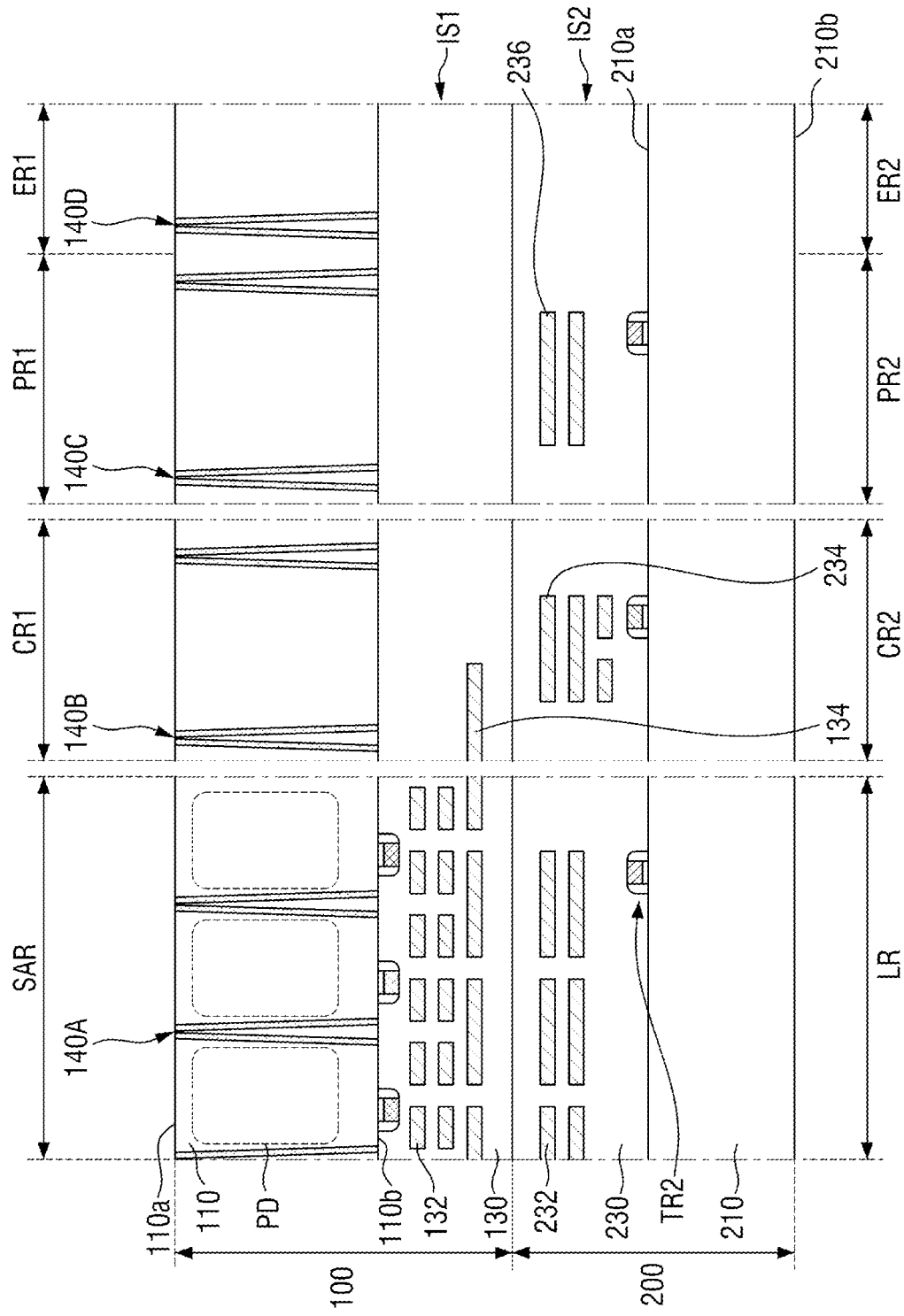

Referring to FIG. 16, part of the first substrate 110 may be removed in a state where the first and second substrate structures 100 and 200 are attached together.

As a result, the first, second, third, and fourth isolation films 140A, 140B, 140C, and 140D may be exposed. During the removal of part of the first substrate 110, parts of the first, second, third, and fourth oxide films 142A, 142B, 142C, and 142D may also be removed. Thus, the first, second, third, and fourth filling films 144A, 144B, 144C, and 144D may be exposed from the first surface 110a of the first substrate 110.

Figure 17:
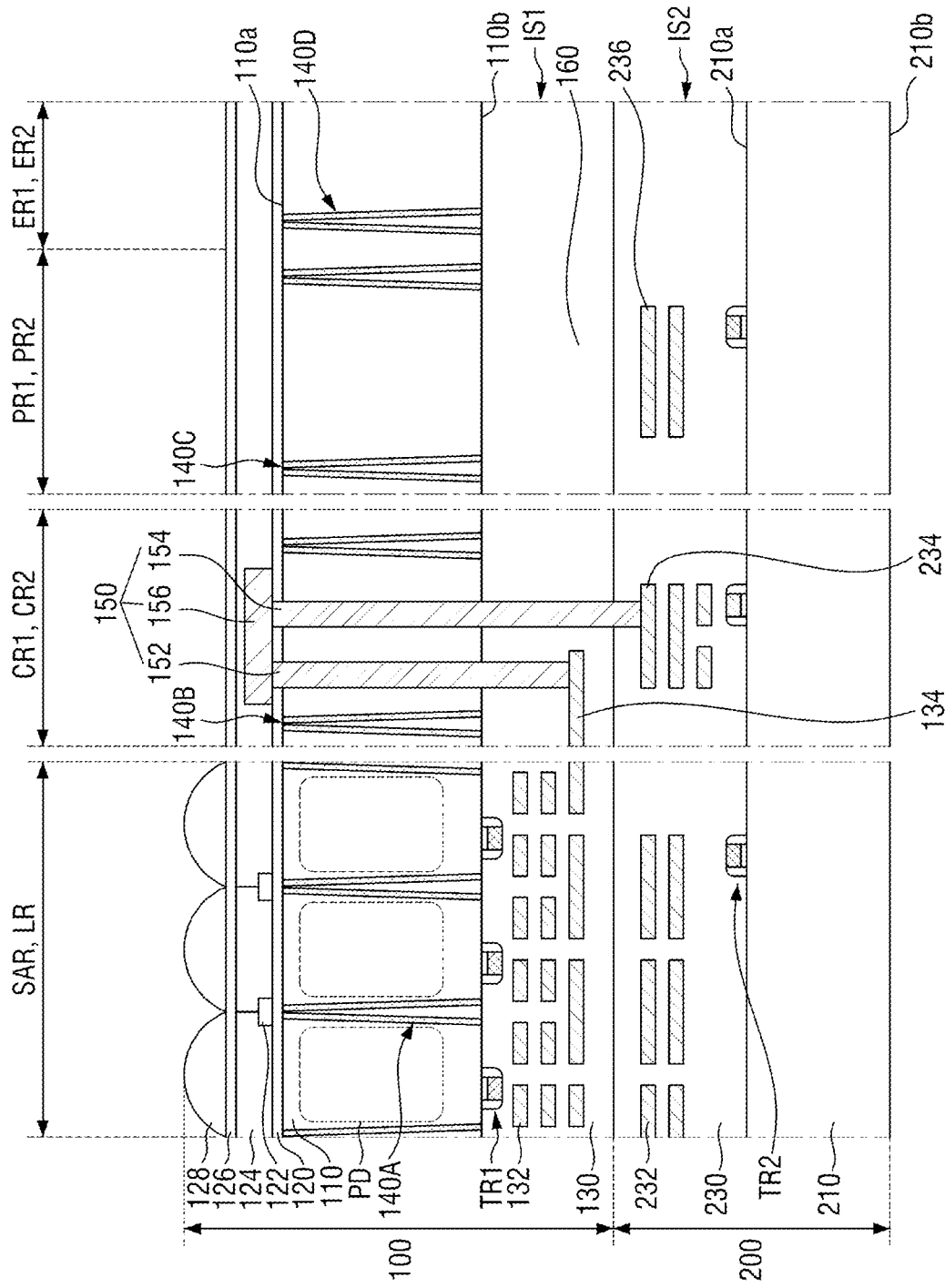

Referring to FIG. 17, a first planarization layer 120, color filters 124, grid patterns 122, a second planarization layer 126, and microlenses 128 are sequentially formed on the first substrate 110 in the sensor array region SAR. The first planarization layer 120 may also be formed in a connecting region (CR1 or CR2), a pad region (PR1 or PR2), and an edge region (ER1 or ER2).

In some embodiments, the first planarization layer 120, the color filters 124, the grid patterns 122, the second planarization layer 126, and the microlenses 128 may be formed on the rear side (e.g., the first surface 110a) of the first substrate 110 (e.g., rear side in relation to the initial steps of manufacturing the first substrate 110).

In some embodiments, before the formation of the second planarization layer 126, a connecting structure 150 may be formed in the connecting region (CR1 or CR2). The connecting structure 150 may electrically connect the first and second wiring structures IS1 and IS2.

For example, a first through via 152, which is connected to the wiring (e.g., the second wiring 134) of the first wiring structure IS1, may be formed in the connecting region (CR1 or CR2) through the first planarization layer 120 and the first substrate 110. Also, for example, a second through via 154, which is connected to the wiring (e.g., the fourth wiring 234) of the second wiring structure IS2, may be formed in the connecting region (CR1 or CR2) through the first planarization layer 120 and the first substrate 110. Thereafter, connecting wiring 156, which connects the first and second through vias 152 and 154, may be formed on the first planarization layer 120 in the connecting region (CR1 or CR2). Accordingly, the second and fourth wirings 134 and 234 may be connected.

In some embodiments, the connecting structure 150 may be formed to be isolated from the sensor array region SAR by the second isolation film 140B. In some embodiments, the second isolation film 140B may surround the sides of the connecting structure 150. Accordingly, the second isolation film 140B may electrically isolate the connecting structure 150 within the first substrate 110.

Thereafter, referring again to FIG. 3, a ball bonding terminal 160 is formed in the pad region (PR1 or PR2).

For example, a pad trench PT, which exposes the fifth wiring 236 through the first substrate 110, may be formed in the pad region (PR1 or PR2). The pad trench PT may expose the fifth wiring 236 through, for example, the second planarization layer 126, the first planarization layer 120, the first substrate 110, and the first wiring structure IS1. The ball bonding terminal 160 may be formed in the pad trench PT to be connected to the top surface of the fifth wiring 236.

The ball bonding terminal 160 may include at least one of, for example, W, Cu, Al, Au, Ag, and an alloy thereof, but the present disclosure is not limited thereto.

In some embodiments, the ball bonding terminal 160 may be formed to be spaced apart from the sensor array region SAR by the third isolation film 140C. In some embodiments, the third isolation film 140C may surround the sides of the pad trench PT. Accordingly, the third isolation film 140C may electrically isolate the ball bonding terminal 160 within the first substrate 110.

In some embodiments, an edge trench ET may be formed in the first substrate 110 in the edge region (ER1 or ER2). The edge trench ET may be formed to penetrate, for example, the first substrate 110.

In some embodiments, the edge trench ET may be formed to be spaced apart from the sensor array region SAR by the fourth isolation film 140D.

In a BSI image sensor, an isolation film that defines each unit pixel in a substrate in a sensor array region and includes a material with a lower refractive index than the substrate may be formed. However, if the isolation film is formed by patterning performed on the rear side (e.g., the first surface 110a) of the substrate, the isolation film may not be able to be formed sufficiently deep so that the dark current characteristics of the BSI image sensor may deteriorate.

However, since the first isolation film 140A can be formed on the front side (e.g., the second surface 110b) of the first substrate 110 through patterning, the first isolation film 140A can be formed sufficiently deep. For example, the first isolation film 140A may extend from the second surface 110b of the first substrate 110 to penetrate the first substrate 110. Accordingly, the dark current characteristics of an image sensor can be improved, and crosstalk and blooming phenomena can be addressed. Therefore, an image sensor with improved performance can be provided.

Also, since the first isolation film 140A can be formed at the same level as the second, third, and fourth isolation films 140B, 140C, and 140D, the fabrication of an image sensor can be simplified, and an image sensor with improved productivity can be provided.

Alternatively to what is illustrated in FIGS. 11 through 13, the photoelectric conversion layers PD may be formed in the first substrate 110 before the formation of the first, second, third, and fourth isolation films 140A, 140B, 140C, and 140D.

While the present inventive concept has been particularly shown and described with reference to exemplary embodiments thereof, it will be understood by those of ordinary skill in the art that various changes in form and details may be made therein without departing from the spirit and scope of the present inventive concept. It is therefore desired that the present embodiments be considered in all respects as illustrative and not restrictive, reference being made to the appended claims rather than the foregoing description to indicate the scope of the invention.

It will be understood that, although the terms first, second, third etc. may be used herein to describe various elements, components, regions, layers and/or sections, these elements, components, regions, layers and/or sections should not be limited by these terms. Unless the context indicates otherwise, these terms are only used to distinguish one element, component, region, layer or section from another element, component, region, layer or section, for example as a naming convention. Thus, a first element, component, region, layer or section discussed below in one section of the specification could be termed a second element, component, region, layer or section in another section of the specification or in the claims without departing from the teachings of the present invention. In addition, in certain cases, even if a term is not described using "first," "second," etc., in the specification, it may still be referred to as "first" or "second" in a claim in order to distinguish different claimed elements from each other.

What is claimed is:

1. An image sensor including a sensor array region and a pad region, which is disposed outside the sensor array region, the image sensor comprising:
   a first substrate including a first surface, upon which light is incident, and a second surface, which is opposite to the first surface;
   a first isolation film in the first substrate at the sensor array region, the first isolation film defining a plurality of unit pixels;
   a second substrate including a third surface, which faces the second surface of the first substrate, and a fourth surface, which is opposite to the third surface;
   a wiring structure between the second and third surfaces, the wiring structure including an interlayer insulating film and a wiring in the interlayer insulating film;
   a pad trench in the pad region, the pad trench exposing the wiring through the first substrate;
   a bonding terminal in the pad trench, the bonding terminal being connected to the wiring; and
   a second isolation film in the first substrate at the pad region, the second isolation film being adjacent to the pad trench, wherein widths of each of the first and second isolation films decrease in a direction from the second surface to the first surface, wherein the first and second isolation films include respective oxide films, which extend along substrate trenches in the first substrate, wherein each of the first and second isolation films further includes a filling film, which fills the substrate trenches, on the respective oxide films, and wherein the substrate trenches extend from the first surface to the second surface.

2. The image sensor of claim 1, wherein the filling film includes polysilicon.

3. The image sensor of claim 1, wherein the first and second isolation films are formed at the same level.

4. The image sensor of claim 1, wherein each of the first and second isolation films extends from the second surface of the first substrate to penetrate the first substrate.

5. The image sensor of claim 4, wherein each of the first and second isolation films protrudes beyond the first surface.

6. The image sensor of claim 1, wherein the first isolation film and the second isolation film are both disposed at the second surface, and widths of the first isolation film and the second isolation film at the second surface differ from each other.

7. The image sensor of claim 1, further comprising:
a connecting region between the sensor array region and the pad region; and
a through via penetrating the first substrate at the connecting region.

8. The image sensor of claim 7, further comprising:
a third isolation film adjacent to the through via, in the first substrate at the connecting region,
wherein a width of the third isolation film decreases in the direction from the second surface to the first surface.

9. An image sensor including a sensor array region, and a connecting region and a pad region, which are disposed outside the sensor array region, the image sensor comprising:
a first substrate including a first surface, upon which light is incident, and a second surface, which is opposite to the first surface;
a first isolation film in the first substrate at the sensor array region, the first isolation film defining a plurality of unit pixels;
a first wiring structure on the second surface of the first substrate, the first wiring structure including a first wiring in the connecting region;
a second substrate including a third surface, which faces the second surface of the first substrate, and a fourth surface, which is opposite to the third surface;
a second wiring structure on the third surface of the second substrate, the second wiring structure including a second wiring in the connecting region and a third wiring in the pad region;
a connecting structure in the connecting region, the connecting structure electrically connecting the first and second wirings;
a second isolation film in the first substrate at the connecting region, the second isolation film being disposed between the sensor array region and the connecting structure;
a bonding terminal in the pad region, the bonding terminal being connected to the third wiring; and
a third isolation film in the first substrate at the pad region, the third isolation film being disposed between the sensor array region and the bonding terminal, wherein widths of each of the first, second, and third isolation films decrease in a direction from the second surface to the first surface.

10. The image sensor of claim 9, wherein the connecting structure includes:
a first through via, which is connected to the first wiring through the first substrate;
a second through via, which is connected to the second wiring through the first substrate and the first wiring structure; and
a connecting wiring, which connects the first and second through vias, on the first surface of the first substrate.

11. The image sensor of claim 9, wherein the connecting structure includes:
a first pillar, which extends from a boundary between the first and second wiring structures to be connected to the first wiring;
and a second pillar, which extends from the boundary between the first and second wiring structures to connect the first pillar and the second wiring.

12. The image sensor of claim 9, wherein the second wiring structure includes a plurality of wirings, and
the second and third wirings are uppermost wirings among the plurality of wirings.

13. The image sensor of claim 9, further comprising:
an edge region adjacent to edges of the image sensor; and
a fourth isolation film in the first substrate at the edge region,
wherein a width of the fourth isolation film decreases in the direction from the second surface to the first surface.

14. The image sensor of claim 13, further comprising:
an edge trench adjacent to the fourth isolation film in the first substrate at the edge region, the edge trench exposing the first wiring structure.

15. An image sensor including a sensor array region and a pad region, which is disposed outside the sensor array region, the image sensor comprising:
a first substrate including a first surface, upon which light is incident, and a second surface, which is opposite to the first surface;
a plurality of photoelectric conversion layers in the first substrate at the sensor array region;
a first isolation film in the first substrate at the sensor array region, the first isolation film separating the photoelectric conversion layers from one another;
a second substrate including a third surface, which faces the second surface of the first substrate, and a fourth surface, which is opposite to the third surface;
a wiring structure between the second and third surfaces, the wiring structure including an interlayer insulating film and a wiring in the interlayer insulating film;
a pad trench in the pad region, the pad trench exposing the wiring through the first substrate;
a bonding terminal in the pad trench, the bonding terminal including a ball portion connected to the wiring; and
a second isolation film in the first substrate at the pad region, the second isolation film being disposed between the sensor array region and the bonding terminal, wherein:
widths of each of the first and second isolation films decrease in a direction from the second surface to the first surface,
the first isolation film includes a first oxide film, which extends along a first substrate trench in the first substrate, the first substrate trench extending from the first surface to the second surface, the second isolation film includes a second oxide film, which extends along a second substrate trench in the first substrate, and the first isolation film further includes a first filling film on the first oxide film, such that the first filling film and first oxide film fill the first substrate trench, and the second isolation film further includes a second filling film on the second oxide film, such that the second filling film and second oxide film fill the second substrate trench.

16. The image sensor of claim 15, further comprising:

color filters disposed on the first surface of the first substrate at the sensor array region; and respective microlenses on the color filters.

17. The image sensor of claim 15, wherein each of the first and second oxide films has a thickness within a range from 10 nm to 100 nm.

* * * * *